United States Patent
Kakinuma et al.

(10) Patent No.: US 11,862,505 B2
(45) Date of Patent: Jan. 2, 2024

(54) PROCESSING APPARATUS

(71) Applicant: DISCO CORPORATION, Tokyo (JP)

(72) Inventors: Yoshinori Kakinuma, Tokyo (JP); Takashi Mori, Tokyo (JP); Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 66 days.

(21) Appl. No.: 17/651,114

(22) Filed: Feb. 15, 2022

(65) Prior Publication Data

US 2022/0270911 A1  Aug. 25, 2022

(30) Foreign Application Priority Data

Feb. 22, 2021 (JP) ................. 2021-026588

(51) Int. Cl.
| | |
|---|---|
| *B32B 43/00* | (2006.01) |
| *H01L 21/683* | (2006.01) |
| *H01L 21/677* | (2006.01) |
| *B23K 26/364* | (2014.01) |
| *B23K 26/402* | (2014.01) |
| *B25J 11/00* | (2006.01) |
| *H05B 1/02* | (2006.01) |
| *B23K 103/00* | (2006.01) |

(52) U.S. Cl.
CPC ........ *H01L 21/6836* (2013.01); *B23K 26/364* (2015.10); *B23K 26/402* (2013.01); *B25J 11/0095* (2013.01); *H01L 21/67775* (2013.01); *H01L 21/6838* (2013.01); *B23K 2103/56* (2018.08); *B32B 43/006* (2013.01); *H05B 1/0233* (2013.01); *Y10T 156/1158* (2015.01); *Y10T 156/1917* (2015.01)

(58) Field of Classification Search
CPC ............. B32B 43/006; Y10T 156/1158; Y10T 156/1917; H01L 21/6836; H01L 21/6838
See application file for complete search history.

(56) References Cited

U.S. PATENT DOCUMENTS

| | | | | |
|---|---|---|---|---|
| 7,896,047 | B2 * | 3/2011 | Yamamoto | ........ H01L 21/67132 156/941 |
| 8,110,058 | B2 * | 2/2012 | Kaneshima | ............. B29C 63/02 156/228 |

(Continued)

FOREIGN PATENT DOCUMENTS

JP  2010109228 A  5/2010

OTHER PUBLICATIONS

Search report issued in counterpart Singapore patent application No. 10202201516P, dated Jun. 27, 2023.

*Primary Examiner* — Philip C Tucker
*Assistant Examiner* — Nickolas R Harm
(74) *Attorney, Agent, or Firm* — Greer Burns & Crain Ltd.

(57) ABSTRACT

A processing apparatus includes a wafer carrying-out unit, a wafer table that supports a wafer carried out, a frame carrying-out unit, a frame table that supports an annular frame carried out, a tape sticking unit that sticks a tape to the frame, a tape-attached frame conveying unit, a tape pressure bonding unit that executes pressure bonding of the tape of a tape-attached frame to a back surface of the wafer, a frame unit carrying-out unit, and a beveled part removing unit that cuts and removes, in a ring manner, a beveled part formed in an outer circumferential surplus region from the wafer of a frame unit.

13 Claims, 17 Drawing Sheets

(56) References Cited

U.S. PATENT DOCUMENTS

| | | | |
|---|---|---|---|
| 2008/0044258 A1* | 2/2008 | Akechi | H01L 21/6835 414/222.01 |
| 2022/0020614 A1 | 1/2022 | Saito et al. | |

* cited by examiner

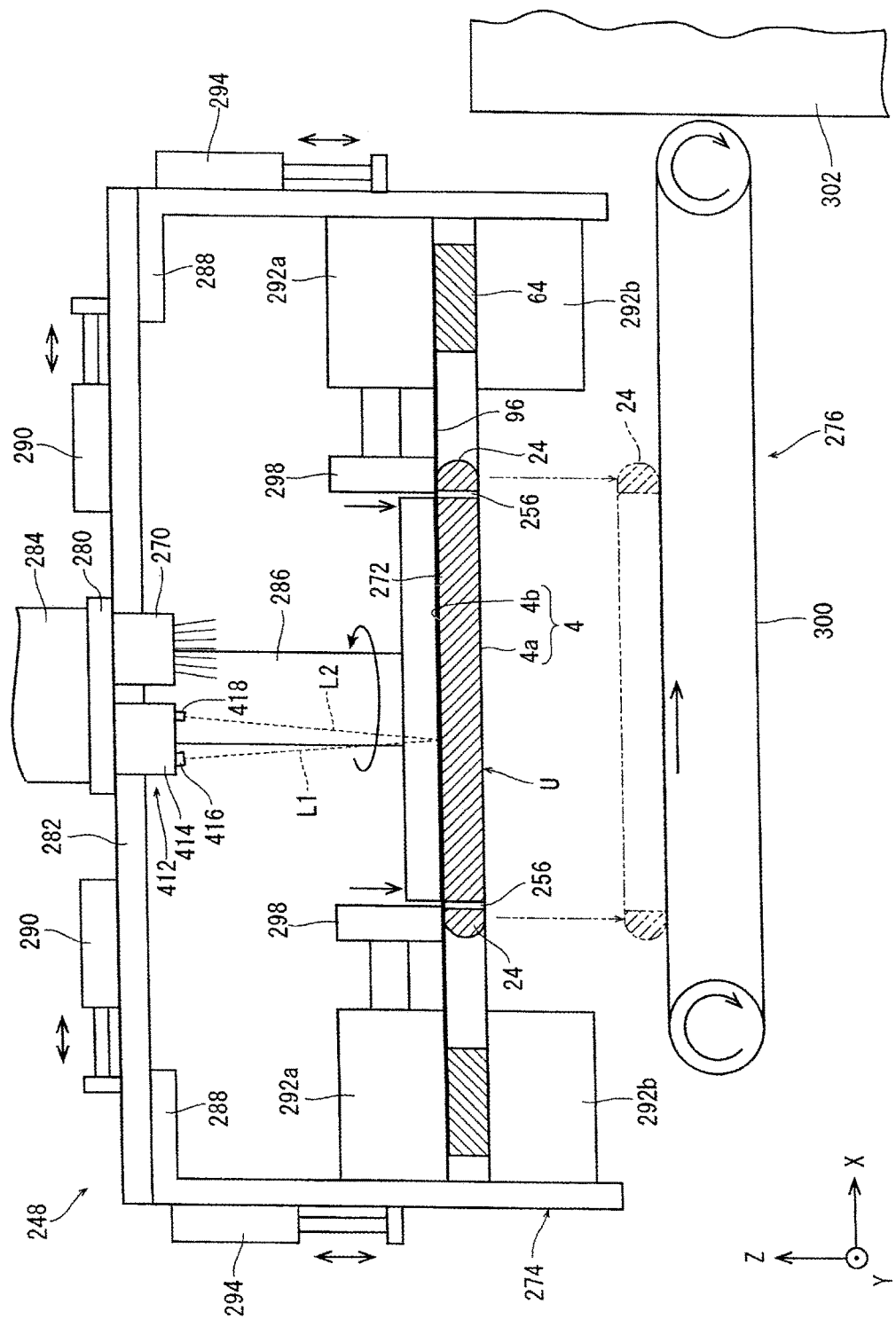

PROCESSING APPARATUS

BACKGROUND OF THE INVENTION

Field of the Invention

The present invention relates to a processing apparatus that removes a beveled part formed in an outer circumferential surplus region from a wafer in a ring manner.

Description of the Related Art

A wafer in which a device region in which plural devices such as an integrated circuit (IC) and large-scale integration (LSI) are formed in such a manner as to be marked out by plural planned dividing lines that intersect and an outer circumferential surplus region that surrounds the device region are formed in a front surface is formed into a desired thickness through grinding of a back surface. Thereafter, the wafer is divided into individual device chips by a dicing apparatus or a laser processing apparatus and the respective device chips obtained by the dividing are used for pieces of electrical equipment, such as mobile phones and personal computers.

A grinding apparatus that grinds the back surface of the wafer is composed of at least a chuck table that holds the wafer and grinding means rotatably including a grinding wheel on which grinding abrasive stones that grind the wafer held by the chuck table are annularly disposed, and can process the wafer into a desired thickness.

In general, beveling processing has been executed for the outer circumference of the wafer. Therefore, when the wafer is thinly processed into a thickness equal to or smaller than half, a knife edge is formed at the beveled part, which becomes a cause of breakage of the wafer. Thus, the present applicant has proposed a technique in which a beveled part formed at the outer circumference of a wafer is removed before the wafer is ground (for example, refer to Japanese Patent Laid-open No. 2010-109228).

SUMMARY OF THE INVENTION

However, there is a problem that an automatic machine that automatically removes a beveled part of a wafer and disposes the wafer in an annular frame with the interposition of a dicing tape does not exist and the productivity is low.

Thus, an object of the present invention is to provide a processing apparatus with which it is easy to remove a beveled part of a wafer and it is easy to dispose the wafer in an annular frame with the interposition of a dicing tape.

In accordance with an aspect of the present invention, there is provided a processing apparatus that removes a beveled part formed in an outer circumferential surplus region from a wafer in a ring manner. The processing apparatus includes a wafer cassette table on which a wafer cassette in which a plurality of wafers are housed is placed, a wafer carrying-out unit that carries out the wafer from the wafer cassette placed on the wafer cassette table, a wafer table that supports the wafer carried out by the wafer carrying-out unit, a frame housing unit that houses a plurality of annular frames in which an opening part that houses the wafer is formed, a frame carrying-out unit that carries out the annular frame from the frame housing unit, a frame table that supports the annular frame carried out by the frame carrying-out unit, a tape sticking unit that is disposed over the frame table and sticks a tape to the annular frame, a tape-attached frame conveying unit that conveys the annular frame to which the tape is stuck to the wafer table and positions the opening part of the annular frame to one surface of the wafer supported by the wafer table and places a tape-attached frame on the wafer table, a tape pressure bonding unit that executes pressure bonding of the tape of the tape-attached frame to the one surface of the wafer, frame unit carrying-out means that carries out a frame unit in which the tape of the tape-attached frame and the one surface of the wafer are pressure-bonded by the tape pressure bonding unit from the wafer table, a beveled part removing unit that cuts and removes, in a ring manner, the beveled part formed in the outer circumferential surplus region from the wafer of the frame unit carried out by the frame unit carrying-out means, beveled-part-free unit carrying-out means that carries out a beveled-part-free unit resulting from the removal of the beveled part in the ring manner from the beveled part removing unit, and a frame cassette table on which a frame cassette that houses the beveled-part-free unit carried out by the beveled-part-free unit carrying-out means is placed.

Preferably, the wafer carrying-out unit includes a conveying arm and a hand that is disposed at a tip of the conveying arm and supports the wafer housed in the wafer cassette. Preferably, the hand is a Bernoulli pad on which a negative pressure is generated by a jet of air and that supports the wafer in a contactless manner.

Preferably, the wafer table includes an annular support part that supports the outer circumferential surplus region of the wafer and causes a part on inside relative to the outer circumferential surplus region to be contactless, and a frame support part that is disposed around outer circumference of the annular support part and supports the annular frame.

Preferably, the tape sticking unit includes a roll tape support part that supports a roll tape into which the tape before use is wound, a tape take-up part that takes up the tape used, a tape pull-out part that pulls out the tape from the roll tape, a pressure bonding part that executes pressure bonding of the tape pulled out to the annular frame, and a cutting part that cuts the tape protruding to outer circumference of the annular frame along the annular frame.

Preferably, the tape pressure bonding unit includes an upper chamber disposed over the wafer table, a lower chamber in which the wafer table is housed, a raising-lowering mechanism that raises and lowers the upper chamber and generates a closed state in which the upper chamber is brought into contact with the lower chamber and an opened state in which the upper chamber is separated from the lower chamber, a vacuum part that sets the upper chamber and the lower chamber to a vacuum state in the closed state, and an opening-to-atmosphere part that opens the upper chamber and the lower chamber to atmosphere, and in a state in which the tape of the tape-attached frame is positioned to the one surface of the wafer supported by the wafer table, the upper chamber and the lower chamber are set to a vacuum state while the raising-lowering mechanism is actuated to keep the closed state, and pressure bonding of the tape of the tape-attached frame to the one surface of the wafer is executed by a pressing roller disposed in the upper chamber.

Preferably, the frame unit carrying-out means includes a frame unit holding part having a wafer holding part that holds the wafer and a frame holding part that holds the annular frame and a conveying part that conveys the frame unit holding part to a temporary placement table.

Preferably, the frame unit carrying-out means includes a two-dimensional movement mechanism that two-dimensionally moves the frame unit holding part in a horizontal direction and an imaging part that images outer circumference of the wafer of the frame unit held by the frame unit holding part, and the two-dimensional movement mechanism is actuated to image at least three places at the outer circumference of the wafer by the imaging part, and center coordinates of the wafer are obtained to make a center of the wafer correspond with a center of the temporary placement table.

Preferably, the beveled part removing unit includes a laser beam irradiation unit that irradiates a base part of the beveled part formed at outer circumference of the wafer with a laser beam to form a cut groove or form a modified layer inside the wafer, a first raising-lowering table that holds and raises the frame unit temporarily placed on the temporary placement table and positions the frame unit to the laser beam irradiation unit, and a separating part that separates the beveled part from the cut groove or the modified layer in a ring manner, the separating part includes an ultraviolet irradiation part that irradiates the tape corresponding to the beveled part with ultraviolet to reduce an adhesive force of the tape, a second raising-lowering table that sucks and holds inside of the wafer in such a manner that the beveled part is exposed from outer circumference, and supports the annular frame, a separator that acts on the beveled part and separates the beveled part in the ring manner, and a discard part by which the beveled part separated is discarded, and the first raising-lowering table temporarily places the frame unit in which the cut groove or the modified layer is formed on the temporary placement table, and the temporary placement table is positioned to the separating part by a temporary placement table conveying part, and the second raising-lowering table supports the frame unit temporarily placed on the temporary placement table.

Preferably, the temporary placement table has a heater and the first raising-lowering table holds, from the temporary placement table, the frame unit in which the tape has been heated by the heater and the tape is in close contact with a root of the beveled part.

Preferably, the temporary placement table includes an annular support part that supports the outer circumferential surplus region of the wafer and causes a part on inside relative to the outer circumferential surplus region to be contactless, and a frame support part that is disposed around outer circumference of the annular support part and supports the annular frame.

Preferably, the beveled-part-free unit carrying-out means includes an inversion mechanism that has a frame holding part that faces the beveled-part-free unit supported by the second raising-lowering table and holds the annular frame and moves toward the frame cassette table and inverts the frame holding part, a beveled-part-free unit support part that supports the beveled-part-free unit that is inverted by the inversion mechanism and in which the other surface of the wafer is oriented upward, and a pushing part that causes the beveled-part-free unit supported by the beveled-part-free unit support part to enter the frame cassette placed on the frame cassette table and be housed in the frame cassette.

Preferably, the beveled part removing unit includes a removal detecting unit that detects whether or not the beveled part has been removed and a cut groove detecting unit that detects the cut groove.

According to the processing apparatus of the present invention, it is easy to remove the beveled part of the wafer and it is easy to dispose the wafer in the annular frame with the interposition of the dicing tape. Thus, the productivity becomes favorable.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 15 is a schematic diagram illustrating the state in which the beveled part is being separated from the wafer in the beveled part removal step;

and

Figure 19:
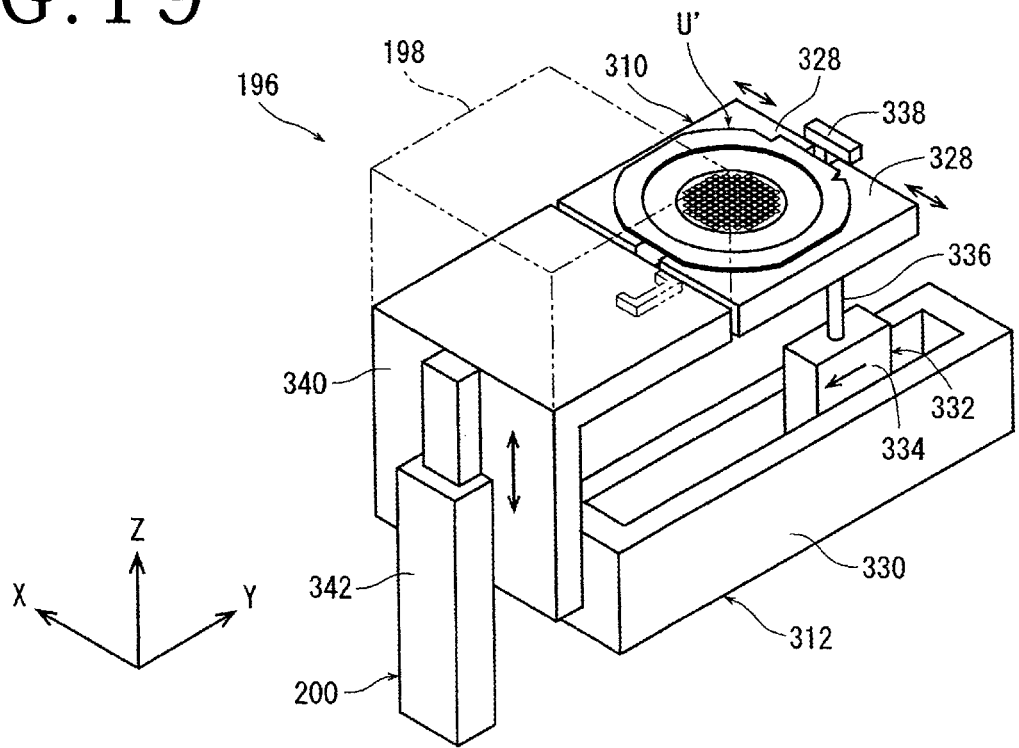

FIG. 19 is a perspective view illustrating the state in which a beveled part-free unit housing step is being executed.

DETAILED DESCRIPTION OF THE PREFERRED EMBODIMENT

A processing apparatus of an embodiment of the present invention will be described below with reference to the drawings.

Figure 1:
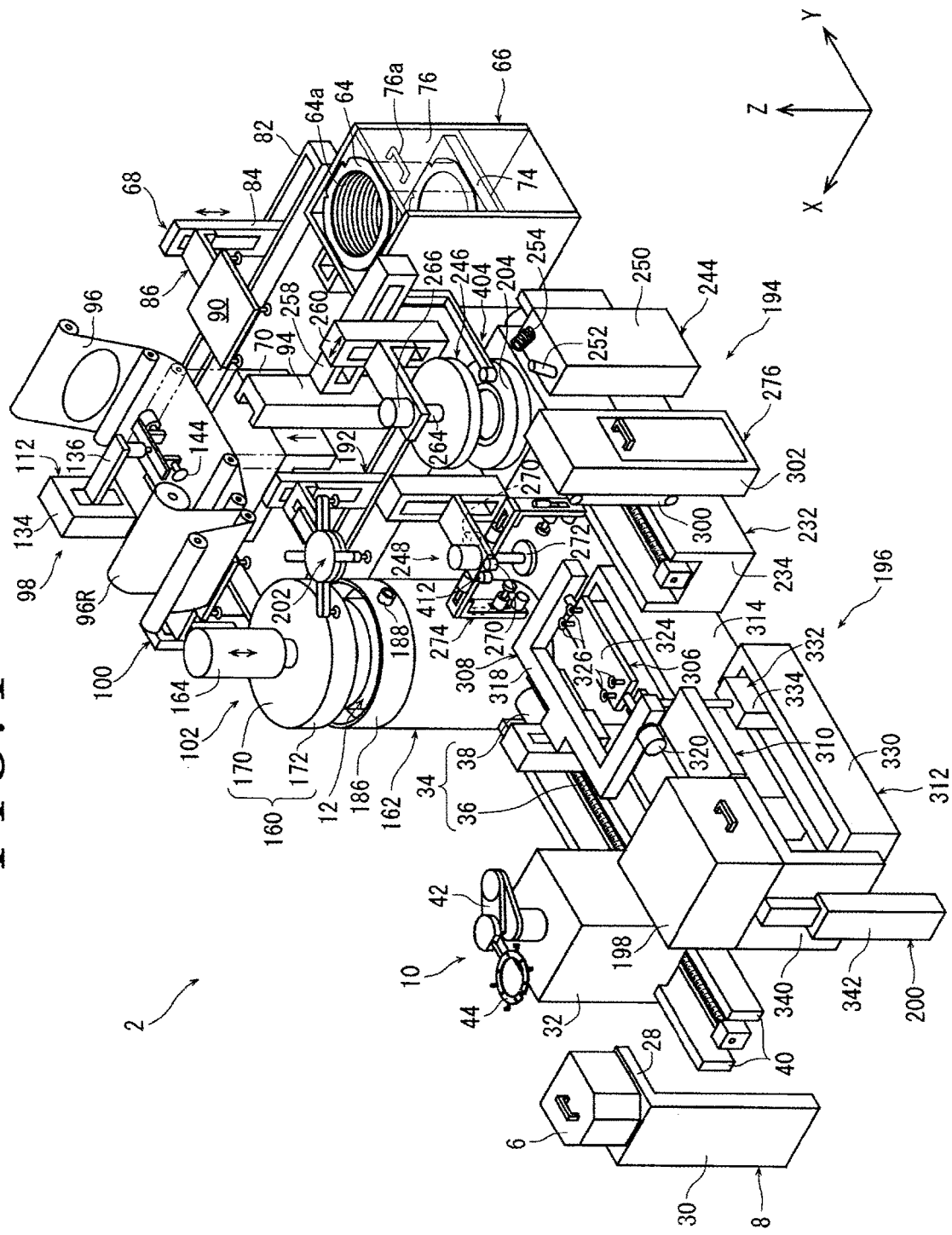
FIG. 1 is a perspective view of a processing apparatus of an embodiment of the present invention.

Referring to FIG. 1, a processing apparatus denoted by numeral 2 totally includes a wafer cassette table 8 on which a wafer cassette 6 in which plural wafers are housed is placed, a wafer carrying-out unit 10 that carries out a wafer from the wafer cassette 6 placed on the wafer cassette table 8, and a wafer table 12 that supports the wafer carried out by the wafer carrying-out unit 10.

Figure 2A:
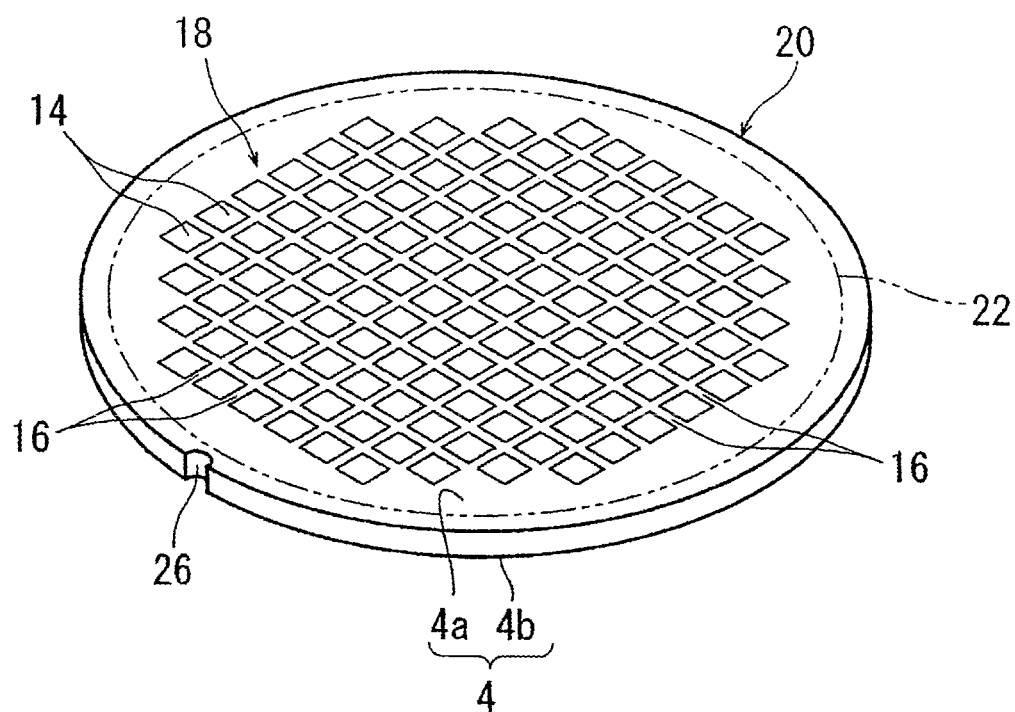
FIG. 2A is a perspective view of a wafer for which processing is executed by the processing apparatus illustrated in FIG. 1.
Figure 2B:
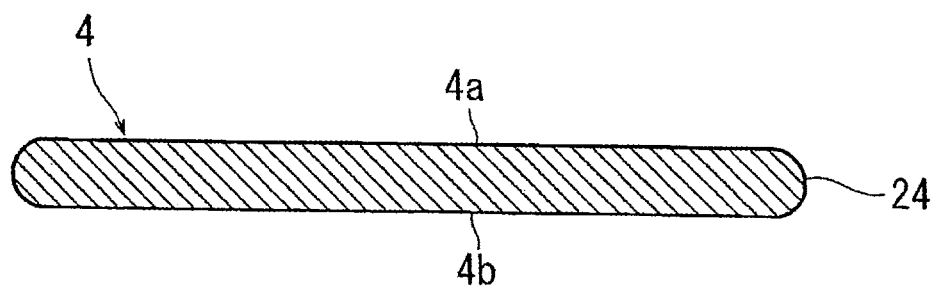
FIG. 2B is a sectional view of the wafer illustrated in FIG. 2A.

In FIGS. 2A and 2B, a wafer 4 for which processing is executed by the processing apparatus 2 is illustrated. In a front surface 4a of the wafer 4, a device region 18 in which plural devices 14 such as an IC and LSI are marked out by planned dividing lines 16 in a lattice manner and an outer circumferential surplus region 20 that surrounds the device region 18 are included. In FIG. 2A, a boundary 22 between the device region 18 and the outer circumferential surplus region 20 is illustrated by a two-dot chain line for convenience. However, actually the line that indicates the boundary 22 does not exist. As illustrated in FIG. 2B, a beveled part 24 is formed in the outer circumferential surplus region 20 of the wafer 4. Furthermore, a notch 26 that indicates a crystal orientation is formed at a circumferential edge of the wafer 4.

Figure 3:
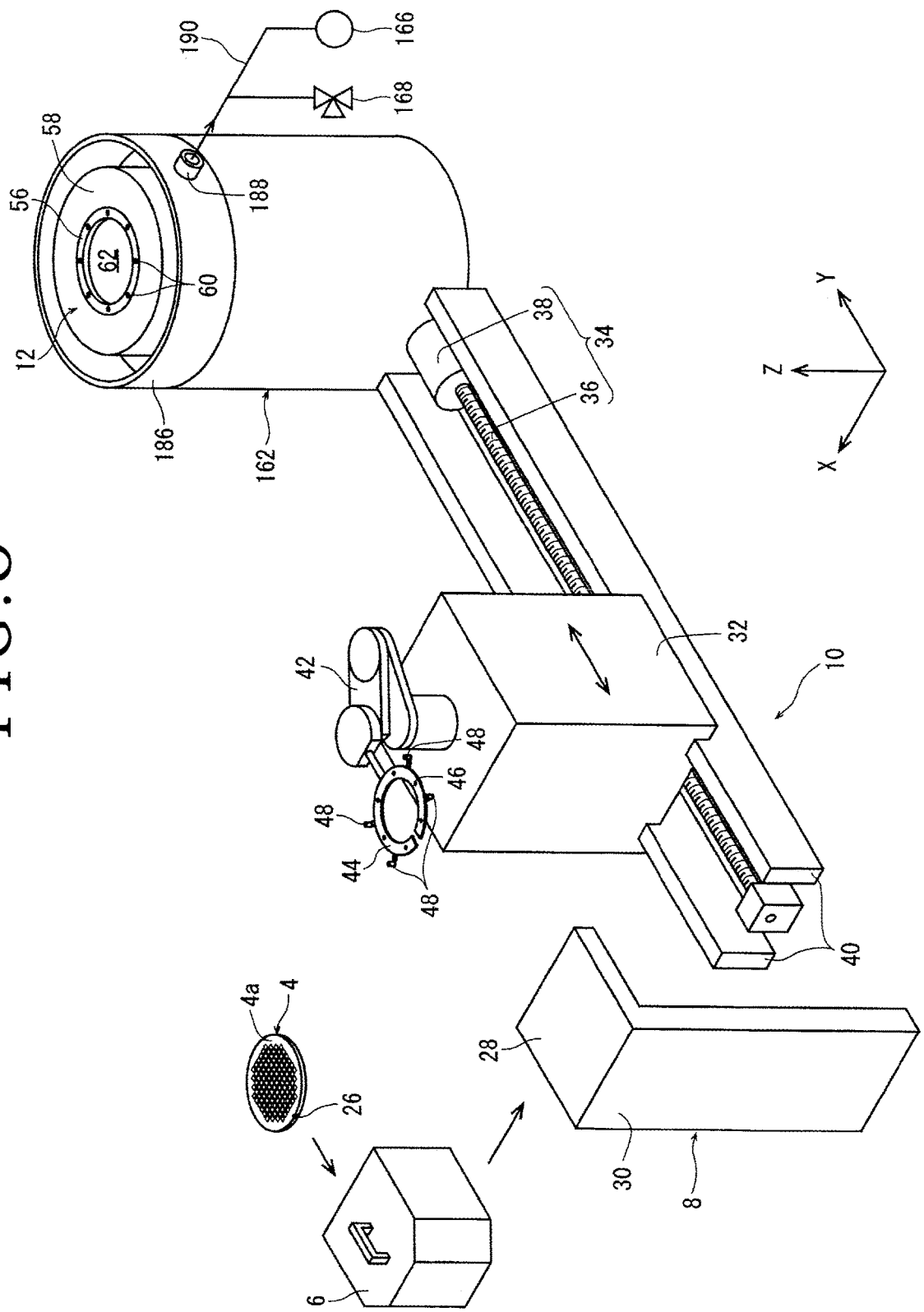
FIG. 3 is a perspective view of a wafer cassette table and so forth illustrated in FIG. 1.

As illustrated in FIG. 3, in the wafer cassette 6, plural wafers 4 are housed at intervals in an upward-downward direction in the state in which the front surfaces 4a are oriented upward. The wafer cassette table 8 of the present embodiment has a top plate 28 on which the wafer cassette 6 is placed and a support plate 30 that supports the top plate 28. The top plate 28 may be capable of rising and lowering and raising-lowering means that raises or lowers the top plate 28 and positions it to desired height may be disposed.

The description will be continued with reference to FIG. 3. The wafer carrying-out unit 10 includes a Y-axis movable component 32 that can move in a Y-axis direction depicted by an arrow Y in FIG. 3 and a Y-axis feed mechanism 34 that moves the Y-axis movable component 32 in the Y-axis direction. The Y-axis feed mechanism 34 has a ball screw 36 that is coupled to a lower end of the Y-axis movable component 32 and extends in the Y-axis direction and a motor 38 that rotates the ball screw 36. The Y-axis feed mechanism 34 converts rotational motion of the motor 38 to linear motion by the ball screw 36 and transmits the linear motion to the Y-axis movable component 32 to move the Y-axis movable component 32 in the Y-axis direction along a pair of guide rails 40 that extend in the Y-axis direction. An X-axis direction depicted by an arrow X in FIG. 3 is a direction orthogonal to the Y-axis direction and a Z-axis direction depicted by an arrow Z in FIG. 3 is the upward-downward direction orthogonal to the X-axis direction and the Y-axis direction. An XY plane defined by the X-axis direction and the Y-axis direction is substantially horizontal.

As illustrated in FIG. 3, the wafer carrying-out unit 10 of the present embodiment includes a conveying arm 42 and a hand 44 that is disposed at a tip of the conveying arm 42 and supports the wafer 4 housed in the wafer cassette 6. The conveying arm 42 is disposed over an upper surface of the Y-axis movable component 32 and is driven by an appropriate drive source (not illustrated) such as an air drive source or electric drive source. This drive source drives the conveying arm 42 and positions the hand 44 to an optional position in each direction of the X-axis direction, the Y-axis direction, and the Z-axis direction. In addition, the drive source inverts the hand 44 upside down.

Figure 4:
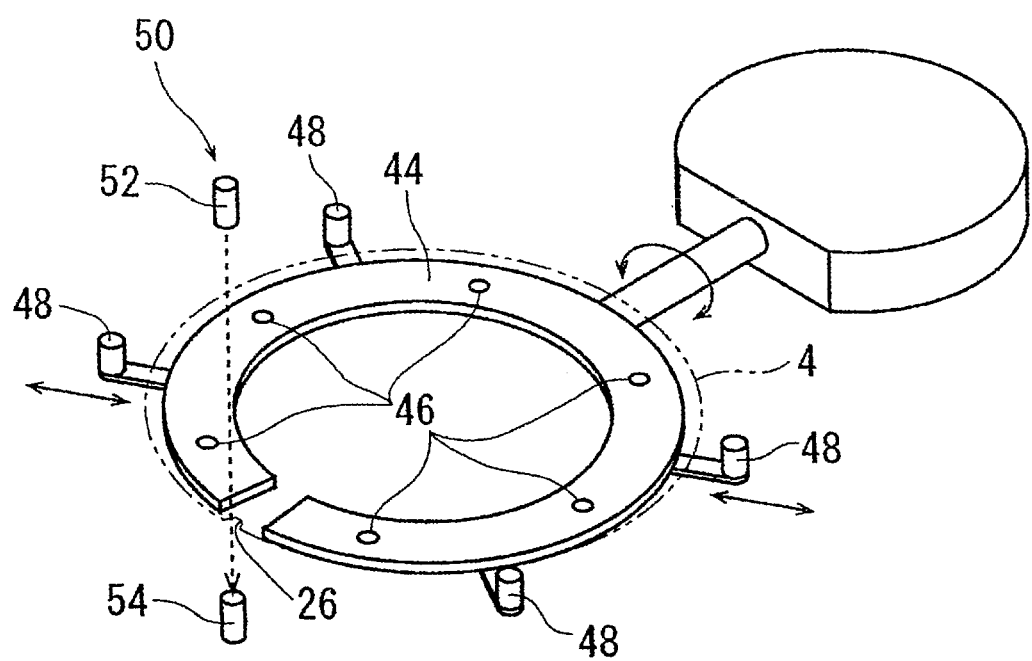
FIG. 4 is a perspective view of a hand illustrated in FIG. 1.

Referring to FIG. 4, it is preferable that the hand 44 be a Bernoulli pad on which a negative pressure is generated by a jet of air and that supports the wafer 4 in a contactless manner. The hand 44 of the present embodiment has a C-shape as a whole and plural air jet ports 46 connected to a compressed air supply source (not illustrated) are formed in a single surface of the hand 44. Plural guide pins 48 are annexed to the outer circumferential edge of the hand 44 at intervals in the circumferential direction. Each guide pin 48 is configured to be movable in a radial direction of the hand 44.

As illustrated in FIG. 3 and FIG. 4, after positioning the hand 44 to the side of the back surface 4b (lower side) of the wafer 4 in the wafer cassette 6 placed on the wafer cassette table 8, the wafer carrying-out unit 10 jets compressed air from the air jet ports 46 of the hand 44 to generate a negative pressure on a single surface side of the hand 44 by the Bernoulli effect, and sucks and supports the wafer 4 from the side of the back surface 4b in a contactless manner by the hand 44. Horizontal movement of the wafer 4 sucked and supported by the hand 44 is restricted by the respective guide pins 48. Then, the wafer carrying-out unit 10 carries out the wafer 4 sucked and supported by the hand 44 from the wafer cassette 6 by moving the Y-axis movable component 32 and the conveying arm 42.

As illustrated in FIG. 4, the wafer carrying-out unit 10 of the present embodiment includes a notch detecting unit 50 that detects the position of the notch 26 of the wafer 4. The notch detecting unit 50 includes, for example, a configuration including a light emitting element 52 and a light receiving element 54 disposed at an interval from each other in the upward-downward direction and a drive source (not illustrated) that rotates at least one of the guide pins 48 of the hand 44.

The light emitting element 52 and the light receiving element 54 can be annexed to the Y-axis movable component 32 or a conveyance route with the interposition of an appropriate bracket (not illustrated). Furthermore, when the guide pin 48 rotates by the above-described drive source, the wafer 4 sucked and supported by the hand 44 rotates due to the rotation of the guide pin 48. It is preferable that the outer circumferential surface of the guide pin 48 rotated by the drive source be formed of appropriate synthetic rubber in order to surely transmit the rotation from the guide pin 48 to the wafer 4.

The notch detecting unit 50 can detect the position of the notch 26 by rotating the wafer 4 by the drive source through the guide pin 48 in the state in which the wafer 4 is sucked and supported by the hand 44 and the outer circumference of the wafer 4 is positioned between the light emitting element 52 and the light receiving element 54. This makes it possible to adjust an orientation of the wafer 4 to an optional orientation.

As illustrated in FIG. 3, the wafer table 12 is disposed adjacent to the wafer carrying-out unit 10. The wafer table 12 of the present embodiment includes an annular support part 56 that supports the outer circumferential surplus region 20 of the wafer 4 and causes the part on the inside relative to the outer circumferential surplus region 20 to be contactless and a frame support part 58 that is disposed around the outer circumference of the annular support part 56 and supports an annular frame 64 (see FIG. 5) to be described later. Plural suction holes 60 disposed at intervals in the circumferential direction are formed in the upper surface of the annular support part 56 and each suction hole 60 is connected to suction means (not illustrated). The part on the inside in the radial direction relative to the annular support part 56 in the wafer table 12 is a circular recess 62 that is hollow downward.

When the hand 44 inverts by 180° to invert the front and back sides of the wafer 4 and the wafer 4 is placed on the wafer table 12 in the state in which the front surface 4*a* of the wafer 4 is oriented downward, the outer circumferential surplus region 20 of the wafer 4 is supported by the annular support part 56 and the device region 18 of the wafer 4 is located in the recess 62. Thus, although the wafer 4 is placed on the wafer table 12 in the state in which the front surface 4*a*, on which the devices 14 are formed, is oriented downward, the devices 14 do not get contact with the wafer table 12 and therefore damage to the devices 14 is prevented. Furthermore, the wafer table 12 prevents deviation of the position of the wafer 4 by actuating the suction means and generating a suction force for each suction hole 60 to suck and hold the outer circumferential surplus region 20 after supporting the outer circumferential surplus region 20 by the annular support part 56.

Figure 5:
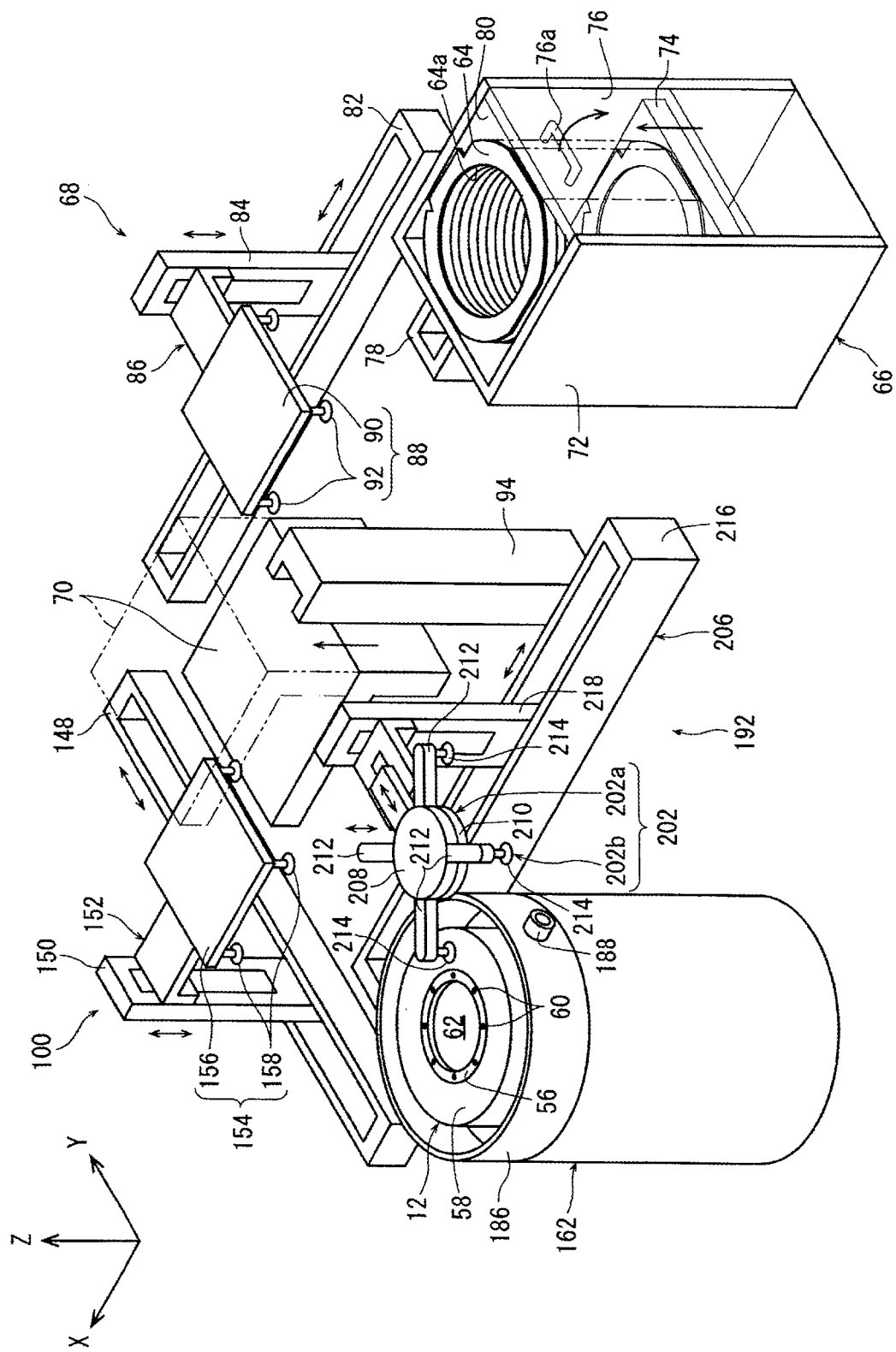
FIG. 5 is a perspective view of a frame housing unit and so forth illustrated in FIG. 1.

Referring to FIG. 5, the processing apparatus 2 further includes a frame housing unit 66 that houses plural ring-shaped annular frames 64 in which an opening part 64*a* that houses the wafer 4 is formed, a frame carrying-out unit 68 that carries out the annular frame 64 from the frame housing unit 66, and a frame table 70 that supports the annular frame 64 carried out by the frame carrying-out unit 68.

As illustrated in FIG. 5, the frame housing unit 66 of the present embodiment includes a housing 72, a rising-lowering plate 74 disposed to be capable of rising and lowering in the housing 72, and raising-lowering means (not illustrated) that raises and lowers the rising-lowering plate 74. A Z-axis guide component 78 that extends in the Z-axis direction is disposed on the side surface of the housing 72 on the far side in the X-axis direction in FIG. 5. The rising-lowering plate 74 is supported by the Z-axis guide component 78 in such a manner as to be capable of rising and lowering and the raising-lowering means that raises and lowers the rising-lowering plate 74 is disposed inside the Z-axis guide component 78. It suffices for the raising-lowering means to be, for example, a configuration having a ball screw that is coupled to the rising-lowering plate 74 and extends in the Z-axis direction and a motor that rotates this ball screw. A door 76 to which a handle 76*a* is annexed is disposed at the side surface of the housing 72 on the near side in the X-axis direction in FIG. 5. In the frame housing unit 66, the annular frames 64 can be housed inside the housing 72 by grasping the handle 76*a* and opening the door 76. Furthermore, an opening part 80 is made at an upper end of the housing 72.

As illustrated in FIG. 5, the annular frames 64 are housed in such a manner as to be stacked over the upper surface of the rising-lowering plate 74 inside the housing 72. The annular frame 64 at the uppermost level in the plural annular frames 64 stacked is carried out from the opening part 80 of the housing 72 by the frame carrying-out unit 68. Furthermore, when the annular frame 64 is carried out from the opening part 80, the frame housing unit 66 raises the rising-lowering plate 74 as appropriate by the raising-lowering means and positions the annular frame 64 at the uppermost level to the position from which the annular frame 64 can be carried out by the frame carrying-out unit 68.

The description will be continued with reference to FIG. 5. The frame carrying-out unit 68 includes an X-axis guide component 82 that is fixed to an appropriate bracket (not illustrated) and extends in the X-axis direction, an X-axis movable component 84 supported by the X-axis guide component 82 movably in the X-axis direction, an X-axis feed mechanism (not illustrated) that moves the X-axis movable component 84 in the X-axis direction, a Z-axis movable component 86 supported by the X-axis movable component 84 movably in the Z-axis direction, and a Z-axis feed mechanism (not illustrated) that moves the Z-axis movable component 86 in the Z-axis direction. It suffices for the X-axis feed mechanism of the frame carrying-out unit 68 to be a configuration having a ball screw that is coupled to the X-axis movable component 84 and extends in the X-axis direction and a motor that rotates this ball screw. It suffices for the Z-axis feed mechanism to be a configuration having a ball screw that is coupled to the Z-axis movable component 86 and extends in the Z-axis direction and a motor that rotates this ball screw.

The Z-axis movable component 86 of the frame carrying-out unit 68 has a holding part 88 that holds the annular frame 64. The holding part 88 of the present embodiment has a rectangular substrate 90 and plural suction pads 92 disposed on the lower surface of the substrate 90. Each suction pad 92 is connected to suction means (not illustrated).

The frame carrying-out unit 68 sucks and holds the annular frame 64 at the uppermost level housed in the frame housing unit 66 by the suction pads 92 of the holding part 88 and thereafter moves the X-axis movable component 84 and the Z-axis movable component 86. Thereby, the frame carrying-out unit 68 carries out the sucked and held annular frame 64 at the uppermost level from the frame housing unit 66.

As illustrated in FIG. 5, the frame table 70 is supported by a Z-axis guide component 94 in such a manner as to be capable of rising and lowering between a lowering position illustrated by solid lines and a rising position illustrated by two-dot chain lines. An appropriate drive source (for example, an air drive source or an electric drive source) that raises and lowers the frame table 70 between the lowering position and the rising position is annexed to the Z-axis guide component 94. In the frame table 70, the annular frame 64 carried out by the frame carrying-out unit 68 is received at the lowering position.

As illustrated in FIG. 1 and FIG. 5, the processing apparatus 2 includes a tape sticking unit 98 (see FIG. 1) that is disposed over the frame table 70 and sticks a tape 96 to the annular frame 64, a tape-attached frame conveying unit 100 (see FIG. 5) that conveys the annular frame 64 to which the tape 96 is stuck (hereinafter, often referred to as "tape-attached annular frame 64'") to the wafer table 12 and positions the opening part 64*a* of the annular frame 64 to the one surface of the wafer 4 supported by the wafer table 12 and places the tape-attached annular frame 64' on the wafer table 12, and a tape pressure bonding unit 102 (see FIG. 1) that executes pressure bonding of the tape 96 of the tape-attached annular frame 64' to the one surface of the wafer 4.

Figure 6A:
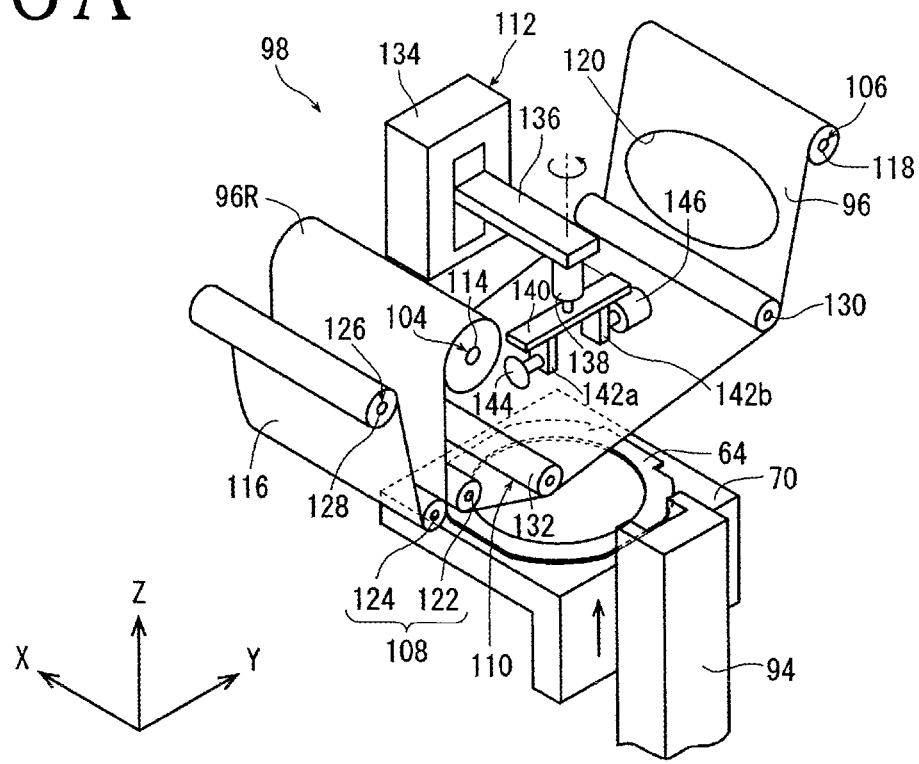
FIG. 6A is a perspective view of a tape sticking unit and so forth in the state in which a frame table illustrated in FIG. 1 is located at a lowering position.
Figure 6B:
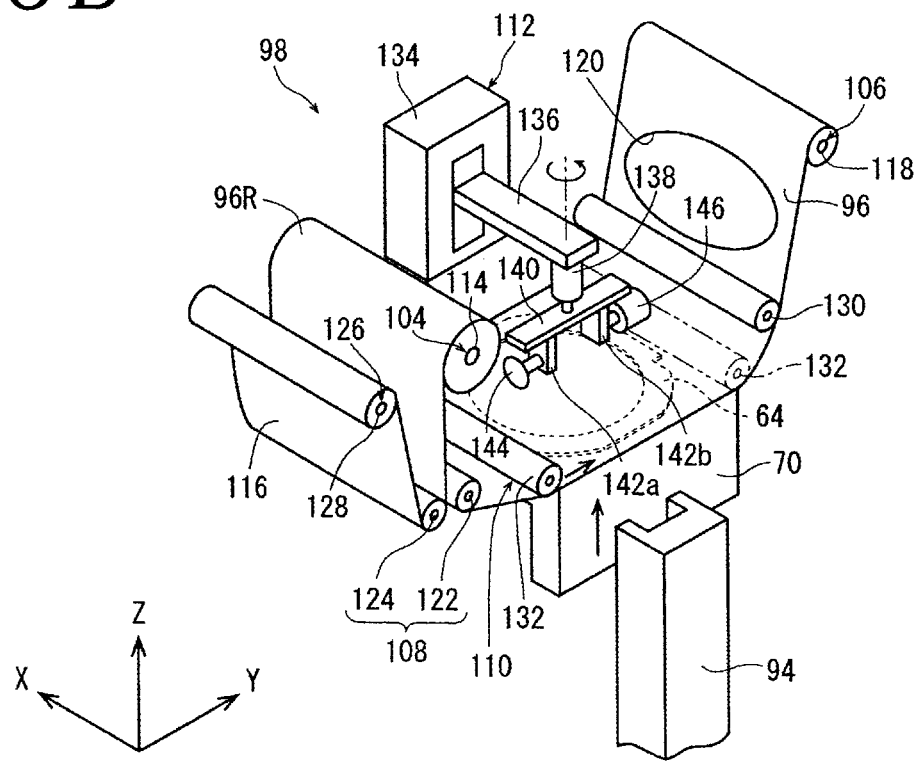
FIG. 6B is a perspective view of the tape sticking unit and so forth in the state in which the frame table illustrated in FIG. 1 is located at a rising position.

Referring to FIG. 6A and FIG. 6B, the tape sticking unit 98 of the present embodiment includes a roll tape support part 104 that supports a roll tape 96R into which the tape 96 before use is wound, a tape take-up part 106 that takes up the tape 96 used, a tape pull-out part 108 that pulls out the tape 96 from the roll tape 96R, a pressure bonding part 110 that executes pressure bonding of the pulled-out tape 96 to the annular frame 64, and a cutting part 112 that cuts the tape 96 protruding to the outer circumference of the annular frame 64 along the annular frame 64.

As illustrated in FIG. 6A and FIG. 6B, the roll tape support part 104 includes a support roller 114 supported by an appropriate bracket (not illustrated) rotatably around an axis line that extends in the X-axis direction. By the support roller 114, the roll tape 96R in which release paper 116 for protecting an adhesive surface of the tape 96 is annexed to the adhesive surface of the tape 96 and that is wound into a circular cylindrical shape is supported.

The tape take-up part 106 includes a take-up roller 118 supported by an appropriate bracket (not illustrated) rotatably around an axis line that extends in the X-axis direction and a motor (not illustrated) that rotates the take-up roller 118. As illustrated in FIG. 6A and FIG. 6B, the tape take-up part 106 takes up the tape 96 used in which a circular opening part 120 corresponding to the part stuck to the annular frame 64 is formed by rotating the take-up roller 118 by the motor.

The description will be continued with reference to FIG. 6A and FIG. 6B. The tape pull-out part 108 includes a pull-out roller 122 disposed below the support roller 114 of the roll tape support part 104, a motor (not illustrated) that rotates the pull-out roller 122, and a driven roller 124 that rotates in association with the rotation of the pull-out roller 122. The tape pull-out part 108 pulls out the tape 96 sandwiched by the pull-out roller 122 and the driven roller 124 from the roll tape 96R by rotating the driven roller 124 together with the pull-out roller 122 by the motor.

The release paper 116 is separated from the tape 96 that has passed between the pull-out roller 122 and the driven roller 124 and the separated release paper 116 is taken up by a release paper take-up part 126. The release paper take-up part 126 of the present embodiment has a release paper take-up roller 128 disposed over the driven roller 124 and a motor (not illustrated) that rotates the release paper take-up roller 128. Furthermore, the tape 96 from which the release paper 116 has been separated goes through a guide roller 130 disposed at an interval from the pull-out roller 122 in the Y-axis direction and is guided to the take-up roller 118.

The pressure bonding part 110 includes a pressing roller 132 disposed movably in the Y-axis direction and a Y-axis feed mechanism (not illustrated) that moves the pressing roller 132 in the Y-axis direction. The Y-axis feed mechanism of the pressure bonding part 110 can be configured from an appropriate drive source (for example, an air drive source or an electric drive source).

As illustrated in FIG. 6A and FIG. 6B, the cutting part 112 includes a Z-axis guide component 134 that is fixed to an appropriate bracket (not illustrated) and extends in the Z-axis direction, a Z-axis movable component 136 supported by the Z-axis guide component 134 movably in the Z-axis direction, and a Z-axis feed mechanism (not illustrated) that moves the Z-axis movable component 136 in the Z-axis direction. It suffices for the Z-axis feed mechanism of the cutting part 112 to be a configuration having a ball screw that is coupled to the Z-axis movable component 136 and extends in the Z-axis direction and a motor that rotates this ball screw.

Furthermore, the cutting part 112 includes a motor 138 fixed to the lower surface of the tip of the Z-axis movable component 136 and an arm piece 140 rotated by the motor 138 around an axis line that extends in the Z-axis direction. To the lower surface of the arm piece 140, first and second drooping pieces 142a and 142b are annexed at an interval from each other. A circular cutter 144 is supported by the first drooping piece 142a rotatably around an axis line orthogonal to the Z-axis direction. A holding-down roller 146 is supported by the second drooping piece 142b rotatably around an axis line orthogonal to the Z-axis direction.

The tape sticking unit 98 pulls out the tape 96 that has not been used by the pull-out roller 122 and the driven roller 124 before the frame table 70 that has received the annular frame 64 from the frame carrying-out unit 68 is positioned from the lowering position (a position illustrated in FIG. 6A) to the rising position (a position illustrated in FIG. 6B). Then, the frame table 70 is positioned to the rising position to such an extent that the tape 96 can be pressed against the annular frame 64 by the pressing roller 132 of the pressure bonding part 110, and the annular frame 64 is brought into contact with the pressing roller 132 with the interposition of the tape 96. Then, the pressing roller 132 is rolled in the Y-axis direction while the adhesive surface of the tape 96 is pressed against the annular frame 64 by the pressing roller 132. This can execute the pressure bonding of the tape 96 pulled out from the roll tape 96R by the tape pull-out part 108 to the annular frame 64.

After the tape 96 is pressure-bonded to the annular frame 64, the tape sticking unit 98 lowers the Z-axis movable component 136 of the cutting part 112 by the Z-axis feed mechanism to press the cutter 144 against the tape 96 on the annular frame 64 and hold down the annular frame 64 by the holding-down roller 146 from over the tape 96. Subsequently, the tape sticking unit 98 rotates the arm piece 140 by the motor 138 and causes the cutter 144 and the holding-down roller 146 to move to draw a circle along the annular frame 64. This can cut the tape 96 that protrudes to the outer circumference of the annular frame 64 along the annular frame 64. Furthermore, because the annular frame 64 is held down by the holding-down roller 146 from over the tape 96, deviation of the position of the annular frame 64 and the tape 96 is prevented when the tape 96 is being cut. Then, after the frame table 70 is lowered, the tape 96 used in which the circular opening part 120 corresponding to the part stuck to the annular frame 64 is formed is taken up by the tape take-up part 106.

As illustrated in FIG. 5, the tape-attached frame conveying unit 100 includes a Y-axis guide component 148 that is fixed to an appropriate bracket (not illustrated) and extends in the Y-axis direction, a Y-axis movable component 150 supported by the Y-axis guide component 148 movably in the Y-axis direction, a Y-axis feed mechanism (not illustrated) that moves the Y-axis movable component 150 in the Y-axis direction, a Z-axis movable component 152 supported by the Y-axis movable component 150 movably in the Z-axis direction, and a Z-axis feed mechanism (not illustrated) that moves the Z-axis movable component 152 in the Z-axis direction. It suffices for the Y-axis feed mechanism of the tape-attached frame conveying unit 100 to be a configuration having a ball screw that is coupled to the Y-axis movable component 150 and extends in the Y-axis direction and a motor that rotates this ball screw. It suffices for the Z-axis feed mechanism to be a configuration having a ball screw that is coupled to the Z-axis movable component 152 and extends in the Z-axis direction and a motor that rotates this ball screw.

The Z-axis movable component 152 of the tape-attached frame conveying unit 100 has a holding part 154 that holds the tape-attached annular frame 64'. The holding part 154 of the present embodiment has a rectangular substrate 156 and plural suction pads 158 disposed on the lower surface of the substrate 156. Each suction pad 158 is connected to suction means (not illustrated).

The tape-attached frame conveying unit 100 sucks and holds the upper surface of the tape-attached annular frame 64' supported by the frame table 70 in the state in which the adhesive surface of the tape 96 is oriented downward by the respective suction pads 158 of the holding part 154, and moves the Y-axis movable component 150 and the Z-axis movable component 152. Thereby, the tape-attached frame conveying unit 100 conveys the tape-attached annular frame 64' sucked and held by the holding part 154 from the frame table 70 to the wafer table 12, and positions the opening part 64a of the annular frame 64 to the one surface of the wafer 4 supported by the wafer table 12 and places the tape-attached annular frame 64' on the wafer table 12.

Figure 7:
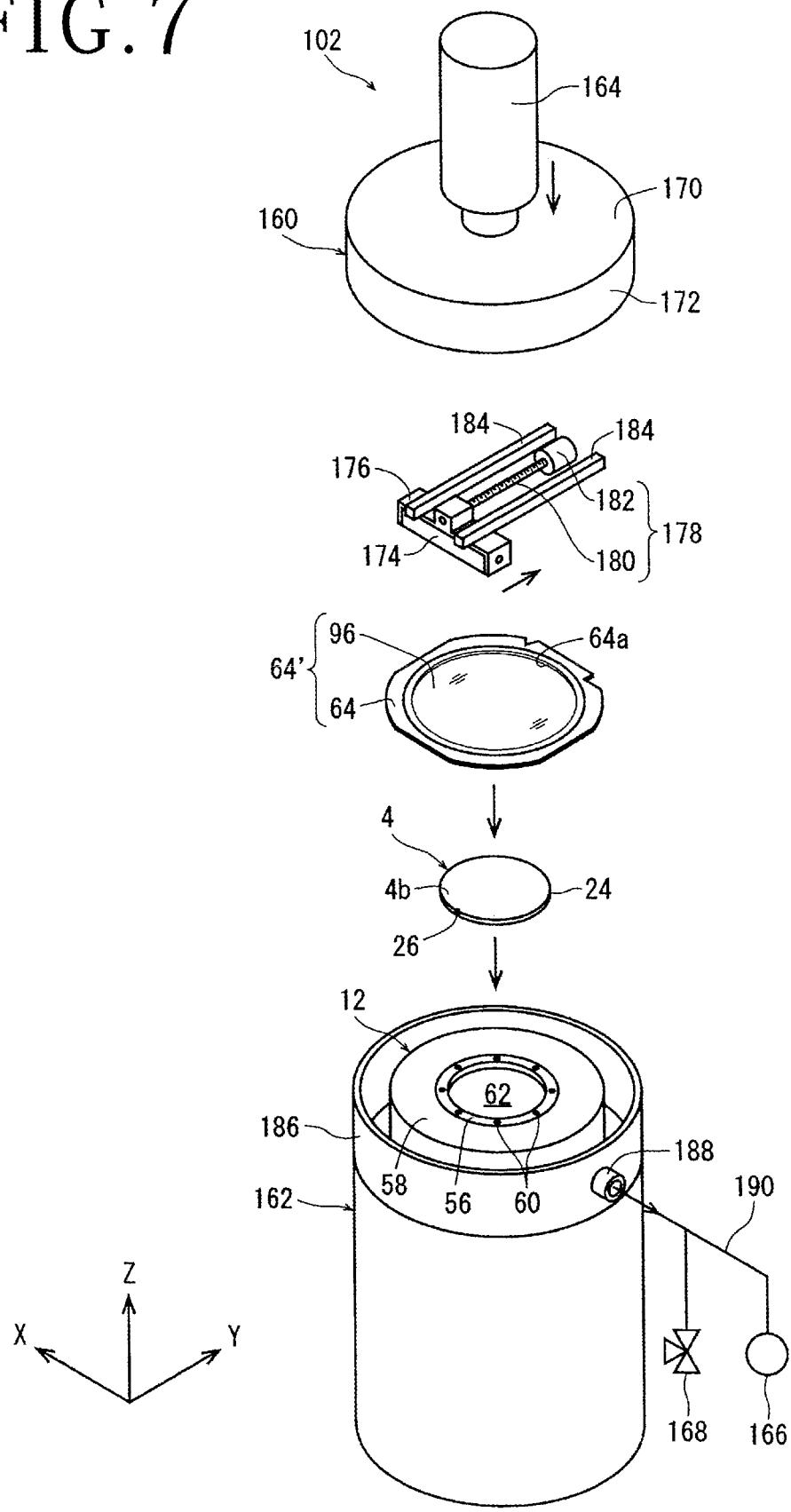
FIG. 7 is an exploded perspective view of a tape pressure bonding unit illustrated in FIG. 1.

The tape pressure bonding unit 102 will be described with reference to FIG. 7 to FIG. 9. As illustrated in FIG. 7, the tape pressure bonding unit 102 includes an upper chamber 160 disposed over the wafer table 12, a lower chamber 162 in which the wafer table 12 is housed, and a raising-lowering mechanism 164 that raises and lowers the upper chamber 160 and generates a closed state in which the upper chamber 160 is brought into contact with the lower chamber 162 and an opened state in which the upper chamber 160 is separated from the lower chamber 162. The tape pressure bonding unit 102 further includes a vacuum part 166 that sets the upper chamber 160 and the lower chamber 162 to a vacuum state in the closed state and an opening-to-atmosphere part 168 that opens the upper chamber 160 and the lower chamber 162 to the atmosphere.

As illustrated in FIG. 7, the upper chamber 160 of the present embodiment includes a circular top plate 170 and a circular cylindrical sidewall 172 that droops from the circumferential edge of the top plate 170. The raising-lowering mechanism 164 that can be configured from an appropriate actuator such as an air cylinder is mounted on the upper surface of the top plate 170. In a housing space defined by the lower surface of the top plate 170 and the inner circumferential surface of the sidewall 172, a pressing roller 174 for pressing the tape 96 of the tape-attached annular frame 64' against the one surface of the wafer 4 supported by the wafer table 12, a support piece 176 that supports the pressing roller 174 rotatably, and a Y-axis feed mechanism 178 that moves the support piece 176 in the Y-axis direction are disposed.

The Y-axis feed mechanism 178 has a ball screw 180 that is coupled to the support piece 176 and extends in the Y-axis direction and a motor 182 that rotates the ball screw 180. Furthermore, the Y-axis feed mechanism 178 converts rotational motion of the motor 182 to linear motion by the ball screw 180 and transmits the linear motion to the support piece 176 to move the support piece 176 along a pair of guide rails 184 that extend in the Y-axis direction.

As illustrated in FIG. 7, the lower chamber 162 has a circular cylindrical sidewall 186. The upper part of the sidewall 186 is opened and the lower part of the sidewall 186 is closed. A connection opening 188 is formed in the sidewall 186. The vacuum part 166 that can be configured from an appropriate vacuum pump is connected to the connection opening 188 through a flow path 190. The opening-to-atmosphere part 168 that can be configured from an appropriate valve capable of opening the flow path 190 to the atmosphere is disposed on the flow path 190.

In the state in which the tape 96 of the tape-attached annular frame 64' is positioned to the one surface of the wafer 4 supported by the wafer table 12, the tape pressure bonding unit 102 lowers the upper chamber 160 by the raising-lowering mechanism 164 and brings the lower end of the sidewall 172 of the upper chamber 160 into contact with the upper end of the sidewall 186 of the lower chamber 162 to set the upper chamber 160 and the lower chamber 162 to the closed state. In addition, the tape pressure bonding unit 102 brings the pressing roller 174 into contact with the tape-attached annular frame 64'.

Subsequently, the tape pressure bonding unit 102 actuates the vacuum pump that configures the vacuum part 166 in the state in which the valve that configures the opening-to-atmosphere part 168 is closed, to set the inside of the upper chamber 160 and the lower chamber 162 to a vacuum state. Thereafter, as illustrated in FIG. 8 and FIG. 9, the tape pressure bonding unit 102 rolls the pressing roller 174 in the Y-axis direction by the Y-axis feed mechanism 178 to thereby execute pressure bonding of the tape 96 to the one surface of the wafer 4 and generate a frame unit U.

In the present embodiment, the pressure bonding of the wafer 4 and the tape 96 is executed in the state in which the inside of the upper chamber 160 and the lower chamber 162 is set to the vacuum state. Thus, when the opening-to-atmosphere part 168 is opened after the tape 96 is pressure-bonded, the tape 96 is pressed against the wafer 4 by the atmospheric pressure. Due to this, the tape 96 gets close contact with the one surface of the wafer 4.

Figure 10:
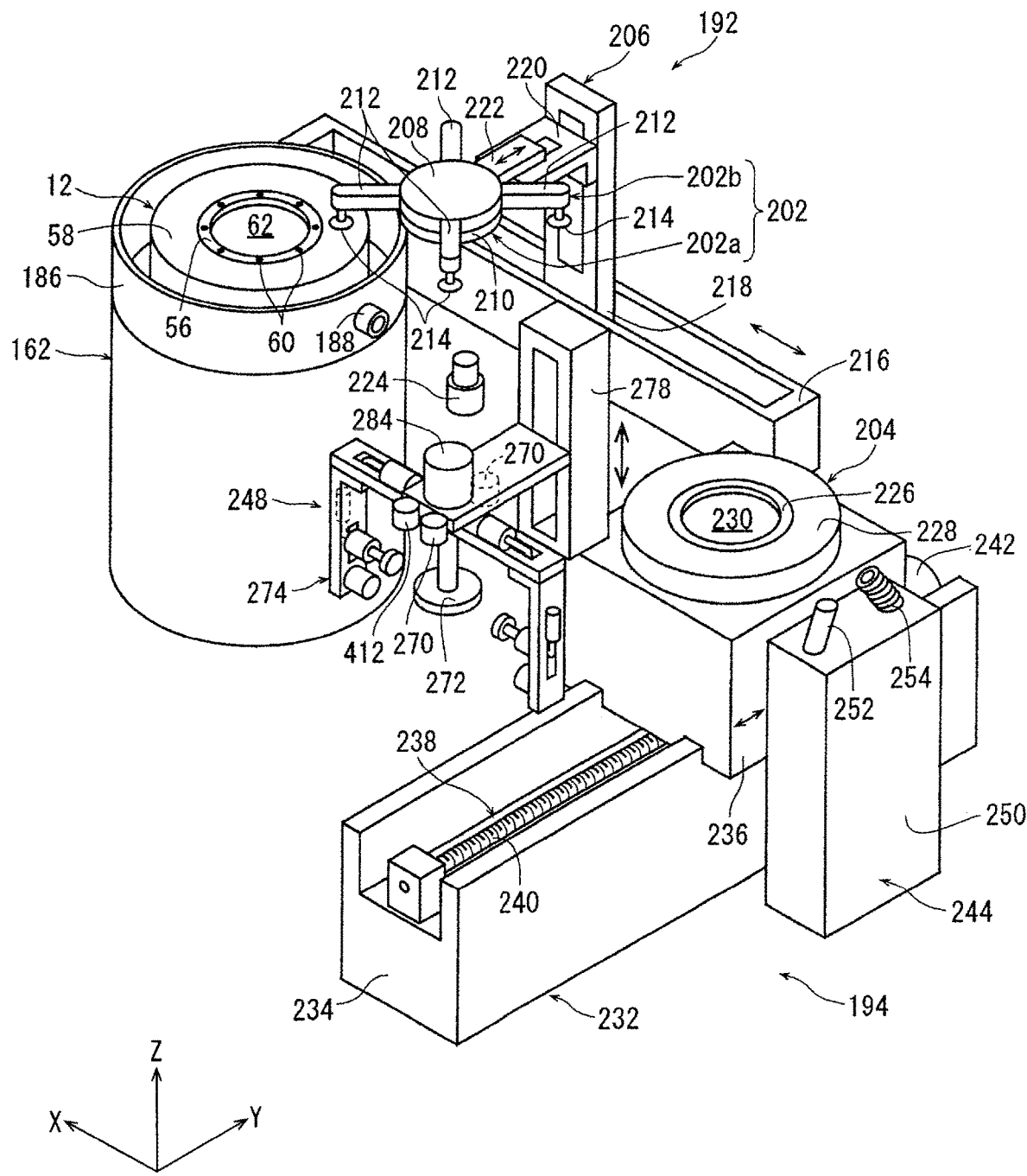
FIG. 10 is a perspective view of a beveled part removing unit illustrated in FIG. 1.

As illustrated in FIG. 1 and FIG. 10, the processing apparatus 2 further includes frame unit carrying-out means 192 that carries out, from the wafer table 12, the frame unit U in which the tape 96 of the tape-attached annular frame 64' and the one surface of the wafer 4 are pressure-bonded by the tape pressure bonding unit 102 and a beveled part removing unit 194 that cuts and removes, in a ring manner, the beveled part 24 formed in the outer circumferential surplus region 20 from the wafer 4 of the frame unit U carried out by the frame unit carrying-out means 192. The processing apparatus 2 includes also beveled part-free unit carrying-out means 196 (see FIG. 1) that carries out the beveled part-free unit resulting from the removal of the beveled part 24, in a ring manner, from the beveled part removing unit 194 and a frame cassette table 200 (see FIG. 1) on which a frame cassette 198 that houses the beveled part-free unit carried out by the beveled part-free unit carrying-out means 196 is placed.

As illustrated in FIG. 10, the frame unit carrying-out means 192 of the present embodiment includes a frame unit holding part 202 including a wafer holding part 202a that holds the wafer 4 and a frame holding part 202b that holds the annular frame 64 and a conveying part 206 that conveys the frame unit holding part 202 to a temporary placement table 204.

The wafer holding part 202a of the frame unit holding part 202 includes a circular substrate 208 and a circular suction adhesion piece 210 mounted on the lower surface of the substrate 208. Plural suction holes (not illustrated) are formed in the lower surface of the suction adhesion piece 210 and each suction hole is connected to suction means (not illustrated). The frame holding part 202b includes plural (in the present embodiment, four) protruding pieces 212 that protrude outward in the radial direction from the circumferential edge of the substrate 208 of the wafer holding part 202a with the interposition of intervals in the circumferential direction and suction pads 214 annexed to the lower surfaces of the protruding pieces 212. Each suction pad 214 is connected to suction means (not illustrated).

The conveying part 206 includes an X-axis guide component 216 that is fixed to an appropriate bracket (not illustrated) and extends in the X-axis direction, an X-axis movable component 218 supported by the X-axis guide component 216 movably in the X-axis direction, and an X-axis feed mechanism (not illustrated) that moves the X-axis movable component 218 in the X-axis direction. The conveying part 206 further includes a Z-axis movable component 220 supported by the X-axis movable component 218 movably in the Z-axis direction, a Z-axis feed mechanism (not illustrated) that moves the Z-axis movable component 220 in the Z-axis direction, a Y-axis movable component 222 supported by the Z-axis movable component 220 movably in the Y-axis direction, and a Y-axis feed mechanism (not illustrated) that moves the Y-axis movable component 222 in the Y-axis direction. The substrate 208 of the wafer holding part 202*a* is coupled to the tip of the Y-axis movable component 222. It suffices for each of the X-axis, Y-axis, and Z-axis feed mechanisms of the conveying part 206 to be a configuration having a ball screw and a motor that rotates the ball screw.

It is preferable for the frame unit carrying-out means 192 to include a two-dimensional movement mechanism that two-dimensionally moves the frame unit holding part 202 in the horizontal direction and an imaging part 224 that images the outer circumference of the wafer 4 of the frame unit U held by the frame unit holding part 202. In the present embodiment, the frame unit holding part 202 two-dimensionally moves in the horizontal direction in the XY plane by the X-axis feed mechanism and the Y-axis feed mechanism of the conveying part 206, and the two-dimensional movement mechanism is configured by the conveying part 206. Furthermore, the imaging part 224 of the present embodiment is disposed between the wafer table 12 and the temporary placement table 204 and the outer circumference of the wafer 4 of the frame unit U held by the frame unit holding part 202 is imaged from the lower side of the wafer 4.

The frame unit carrying-out means 192 actuates the conveying part 206 in the state in which the wafer 4 is sucked and held from the side of the back surface 4*b* (side of the tape 96) by the suction adhesion piece 210 of the wafer holding part 202*a* and the annular frame 64 is sucked and held by the suction pads 214 of the frame holding part 202*b*. Thereby, the frame unit carrying-out means 192 carries out the frame unit U held by the frame unit holding part 202 from the wafer table 12.

Furthermore, the frame unit carrying-out means 192 of the present embodiment measures the coordinates of at least three points at the outer circumference of the wafer 4 by actuating the conveying part 206 that configures the two-dimensional movement mechanism and imaging, by the imaging part 224, at least three places at the outer circumference of the wafer 4 of the frame unit U held by the frame unit holding part 202, and obtains the center coordinates of the wafer 4 on the basis of the measured coordinates of the three points. Then, the frame unit carrying-out means 192 makes the center of the wafer 4 correspond with the center of the temporary placement table 204 and temporarily places the frame unit U on the temporary placement table 204.

As illustrated in FIG. 10, the temporary placement table 204 is disposed at an interval from the wafer table 12 in the X-axis direction. The temporary placement table 204 of the present embodiment includes an annular support part 226 that supports the outer circumferential surplus region 20 of the wafer 4 of the frame unit U and causes the part on the inside relative to the outer circumferential surplus region 20 to be contactless and a frame support part 228 that is disposed around the outer circumference of the annular support part 226 and supports the annular frame 64.

The part on the inside in the radial direction relative to the annular support part 226 is a circular recess 230 that is hollow downward. It is preferable that the frame support part 228 of the temporary placement table 204 include a heater (not illustrated) and the tape 96 be softened by heating the tape 96 of the frame unit U temporarily placed on the temporary placement table 204 by the heater and the tape 96 be brought into closer contact with the root of the beveled part 24.

The processing apparatus 2 of the present embodiment includes a temporary placement table conveying part 232 that conveys the temporary placement table 204 in the Y-axis direction. The temporary placement table conveying part 232 includes a Y-axis guide component 234 that extends in the Y-axis direction, a Y-axis movable component 236 supported by the Y-axis guide component 234 movably in the Y-axis direction, and a Y-axis feed mechanism 238 that moves the Y-axis movable component 236 in the Y-axis direction. The temporary placement table 204 is fixed to the upper part of the Y-axis movable component 236. The Y-axis feed mechanism 238 has a ball screw 240 that is coupled to the Y-axis movable component 236 and extends in the Y-axis direction and a motor 242 that rotates the ball screw 240. Furthermore, the temporary placement table conveying part 232 converts rotational motion of the motor 242 to linear motion by the ball screw 240 and transmits the linear motion to the Y-axis movable component 236 to convey the temporary placement table 204 in the Y-axis direction together with the Y-axis movable component 236.

As illustrated in FIG. 1 and FIG. 10, the beveled part removing unit 194 includes a laser beam irradiation unit 244 that irradiates the base of the beveled part 24 formed at the outer circumference of the wafer 4 with a laser beam to form a cut groove or a modified layer inside of the wafer, a first raising-lowering table 246 (see FIG. 1) that holds and raises the frame unit U temporarily placed on the temporary placement table 204 and moves in the X-axis direction to position the frame unit U to the laser beam irradiation unit 244, and a separating part 248 that separates the beveled part 24 from the cut groove or the modified layer into a ring manner.

As illustrated in FIG. 10, the laser beam irradiation unit 244 includes a housing 250 disposed adjacent to the temporary placement table 204 in the X-axis direction, a laser oscillator (not illustrated) that is housed in the housing 250 and emits a laser beam, and a light collector 252 that collects the laser beam emitted by the laser oscillator and irradiates the base of the beveled part 24 formed at the outer circumference of the wafer 4 with the laser beam. The laser beam irradiation unit 244 further includes a suction nozzle 254 that sucks debris generated when the wafer 4 is irradiated with the laser beam and suction means (not illustrated) connected to the suction nozzle 254.

The light collector 252 extends upward from the upper surface of the housing 250 with an inclination toward the side of the suction nozzle 254. Due to this, dropping of debris generated in the irradiation with the laser beam onto the light collector 252 is suppressed. Furthermore, the suction nozzle 254 extends upward from the upper surface of the housing 250 with an inclination toward the side of the light collector 252.

Figure 11:
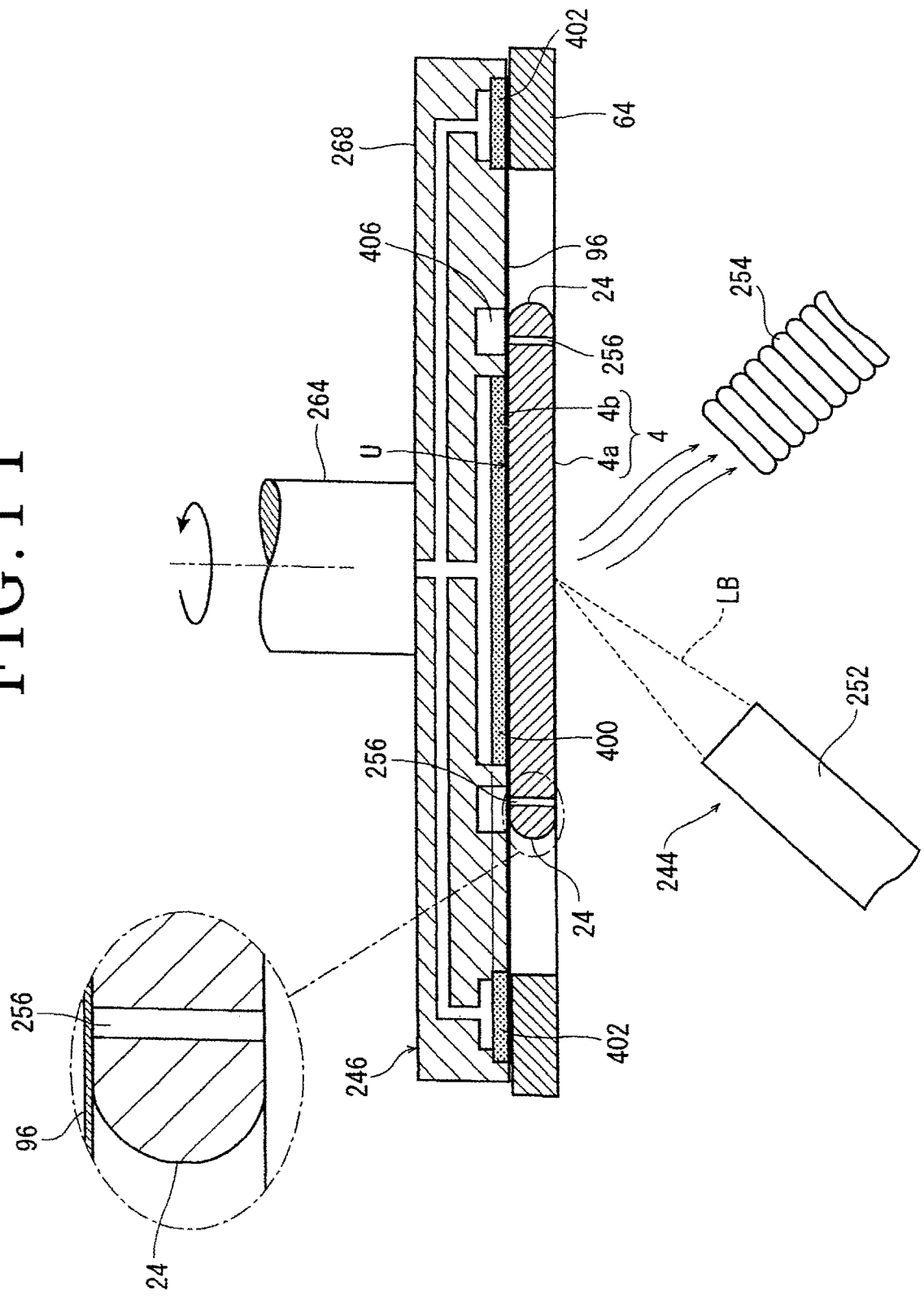
FIG. 11 is a schematic sectional view illustrating the state in which a root of a beveled part is being irradiated with a laser beam in a beveled part removal step.

As illustrated in FIG. 11, the laser beam irradiation unit 244 irradiates the base part (a part slightly closer to the inside than the outer circumferential edge of the wafer 4) of the beveled part 24 formed at the outer circumference of the wafer 4 with a laser beam LB while rotating the frame unit U held by the first raising-lowering table 246, to form a ring-shaped cut groove 256 along the base part of the beveled part 24 by ablation processing or form a modified layer into a ring manner along the base part of the beveled part 24. Furthermore, in the case of forming the cut groove 256, the laser beam irradiation unit 244 sucks debris generated due to the ablation processing by the suction nozzle 254.

Figure 12A:
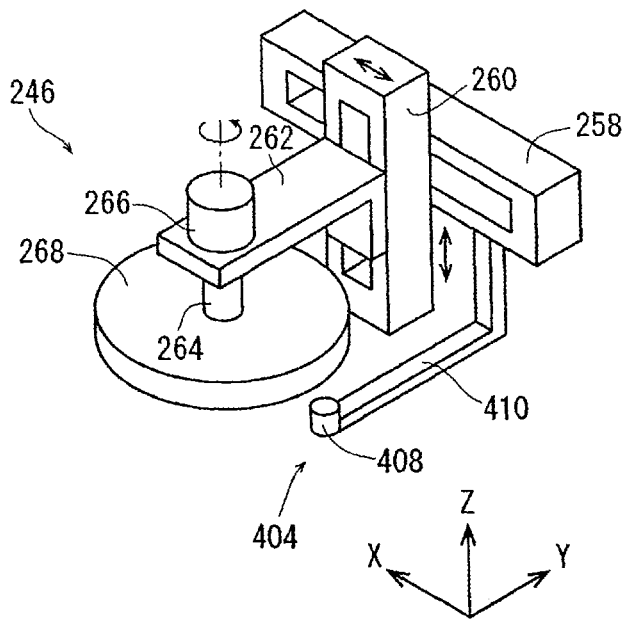
FIG. 12A is a perspective view of a first raising-lowering table of the beveled part removing unit illustrated in FIG. 1.
Figure 12B:
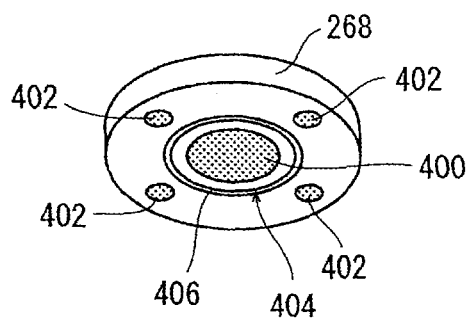
FIG. 12B is a perspective view of a holding piece illustrated in FIG. 12A as viewed from a lower side.
Figure 12C:
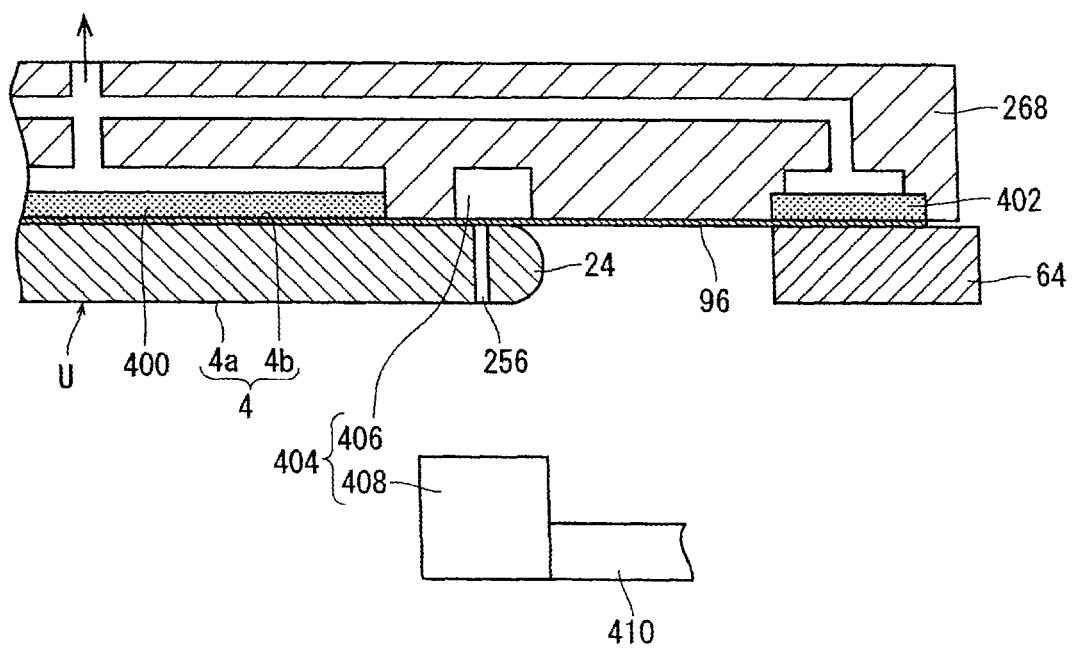
FIG. 12C is a schematic sectional view illustrating the state in which a cut groove is being detected.

As illustrated in FIG. 1, the first raising-lowering table 246 is disposed over the temporary placement table 204 movably in the X-axis direction and movably in the Z-axis direction. Referring to FIGS. 12A to 12C, the first raising-lowering table 246 includes an X-axis guide component 258 that is fixed to an appropriate bracket (not illustrated) and extends in the X-axis direction, an X-axis movable component 260 supported by the X-axis guide component 258 movably in the X-axis direction, an X-axis feed mechanism (not illustrated) that moves the X-axis movable component 260 in the X-axis direction, a Z-axis movable component 262 supported by the X-axis movable component 260 movably in the Z-axis direction, and a Z-axis feed mechanism (not illustrated) that moves the Z-axis movable component 262 in the Z-axis direction. It suffices for each of the X-axis and Z-axis feed mechanisms of the first raising-lowering table 246 to be a configuration having a ball screw and a motor that rotates the ball screw.

A support shaft 264 that extends downward is rotatably supported by the lower surface of the tip of the Z-axis movable component 262. A motor 266 that rotates the support shaft 264 around an axis line extending in the Z-axis direction is attached to the upper surface of the tip of the Z-axis movable component 262. A circular holding piece 268 is fixed to the lower end of the support shaft 264.

As illustrated in FIG. 12B, a wafer suction adhesion chuck 400 with a circular shape and plural frame suction adhesion chucks 402 disposed around the wafer suction adhesion chuck 400 are mounted on the lower surface of the holding piece 268. A diameter of the wafer suction adhesion chuck 400 is slightly smaller than that of the device region 18 of the wafer 4. The plural frame suction adhesion chucks 402 are disposed on a circular circumference corresponding to a size of the annular frame 64 at intervals in the circumferential direction. Furthermore, the wafer suction adhesion chuck 400 and the frame suction adhesion chucks 402 are formed of a porous material and are connected to suction means (not illustrated).

The first raising-lowering table 246 sucks and holds, by the wafer suction adhesion chuck 400, the wafer 4 of the frame unit U in which the tape 96 has been heated by the heater of the frame support part 228 of the temporary placement table 204 and the tape 96 is in close contact with the root of the beveled part 24, and sucks and holds the annular frame 64 by the frame suction adhesion chucks 402. Thereafter, the first raising-lowering table 246 moves the Z-axis movable component 262 and the X-axis movable component 260 to raise the frame unit U sucked and held by the holding piece 268 and move the frame unit U in the X-axis direction and position it to the laser beam irradiation unit 244.

Furthermore, when the wafer 4 is irradiated with the laser beam LB by the laser beam irradiation unit 244, the first raising-lowering table 246 actuates the motor 266 to rotate the frame unit U sucked and held by the holding piece 268. Moreover, the first raising-lowering table 246 moves the frame unit U in which the cut groove 256 or the modified layer is formed at the base of the beveled part 24 in the X-axis direction and the Z-axis direction and temporarily places it on the temporary placement table 204.

As illustrated in FIGS. 12A to 12C, the beveled part removing unit 194 of the present embodiment has a cut groove detecting unit 404 that detects the cut groove 256 formed through the irradiation of the base of the beveled part 24 formed at the outer circumference of the wafer 4 with the laser beam LB. The cut groove detecting unit 404 includes an annular illuminating part 406 disposed in the lower surface of the holding piece 268 of the first raising-lowering table 246 and a light receiving part 408 disposed adjacent to the first raising-lowering table 246.

As illustrated in FIG. 12C, the diameter of the illuminating part 406 is almost the same as that of the cut groove 256 and the illuminating part 406 is located above the cut groove 256 when the frame unit U is held by the holding piece 268. Furthermore, the light receiving part 408 is supported by the X-axis guide component 258 through a bracket 410 and the light receiving part 408 is located below the cut groove 256 when the frame unit U is held by the holding piece 268.

Moreover, in the cut groove detecting unit 404, the cut groove 256 is detected by receiving light of the illuminating part 406 by the light receiving part 408 while rotating the frame unit U held by the first raising-lowering table 246. More specifically, the cut groove detecting unit 404 detects whether or not the cut groove 256 has reached the back surface 4*b* from the front surface 4*a* of the wafer 4, i.e. whether or not the wafer 4 has been completely cut.

When the cut groove 256 has reached the back surface 4*b* from the front surface 4*a* of the wafer 4 and the wafer 4 has been completely cut, the light of the illuminating part 406 passes through the cut groove 256 and reaches the light receiving part 408. Therefore, the amount of light received by the light receiving part 408 becomes comparatively large. The light of the illuminating part 406 is transmitted through the tape 96 and therefore the amount of light received by the light receiving part 408 is not affected by the tape 96. On the other hand, when the cut groove 256 has not reached the back surface 4*b* from the front surface 4*a* of the wafer 4 and an incompletely-cut part that has not been completely cut exists in the wafer 4, the light of the illuminating part 406 is blocked by the incompletely-cut part. Therefore, the amount of light received by the light receiving part 408 becomes comparatively small when the incompletely-cut part is located above the light receiving part 408. Thus, the cut groove detecting unit 404 determines that the wafer 4 has been completely cut when the amount of light received by the light receiving part 408 is equal to or larger than a predetermined threshold over the whole circumference of the cut groove 256. Conversely, the cut groove detecting unit 404 determines that the wafer 4 has not been completely cut when a region about which the amount of light received by the light receiving part 408 is smaller than the above-described threshold exists.

Figure 13:
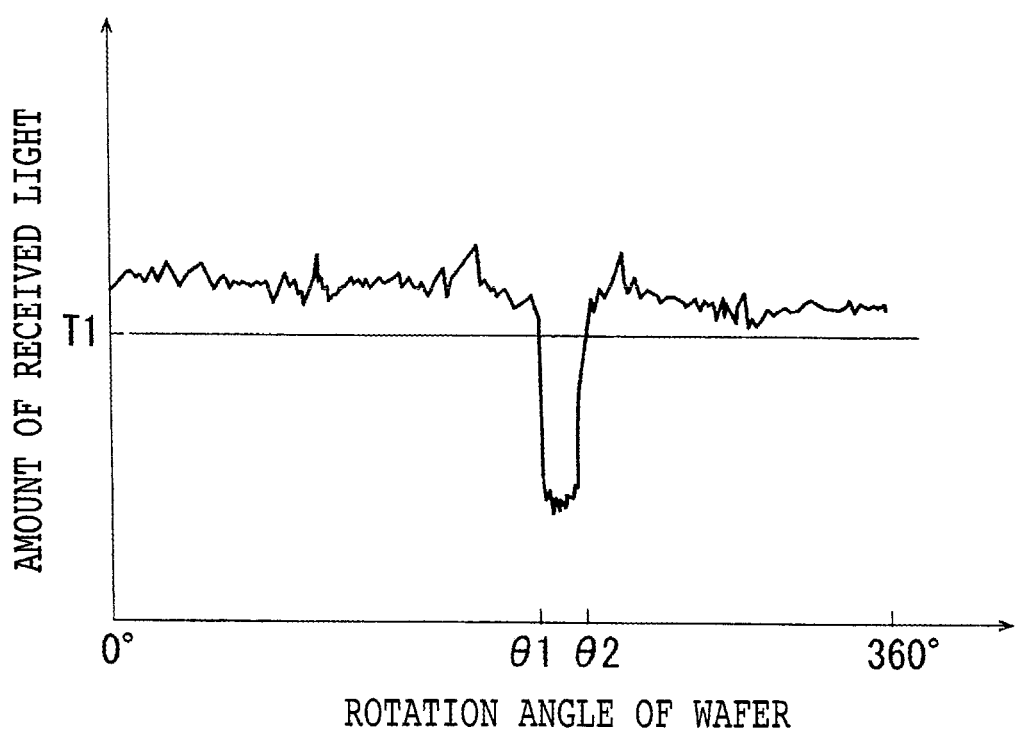
FIG. 13 is a graph illustrating one example of a relation between an amount of light received by a light receiving part of a cut groove detecting unit and a rotation angle of the wafer.

In an example illustrated in FIG. 13, the amount of light received by the light receiving part 408 is equal to or larger than a threshold T1 in a region in which the rotation angle of the wafer 4 is 0° to θ1 and a region in which it is θ2 to 360°. However, the amount of light received by the light receiving part 408 is smaller than the threshold T1 in a region in which the rotation angle of the wafer 4 is θ1 to θ2. Therefore, it is determined that an incompletely-cut part exists in the wafer 4.

The cut groove detecting unit 404 may include, instead of the above-described light receiving part 408, a camera that images the cut groove 256 from the lower side when the frame unit U is held by the holding piece 268, and it is also possible to detect whether or not the cut groove 256 has reached the back surface 4*b* from the front surface 4*a* of the wafer 4 on the basis of an image of the cut groove 256 imaged by the camera.

Figure 14A:
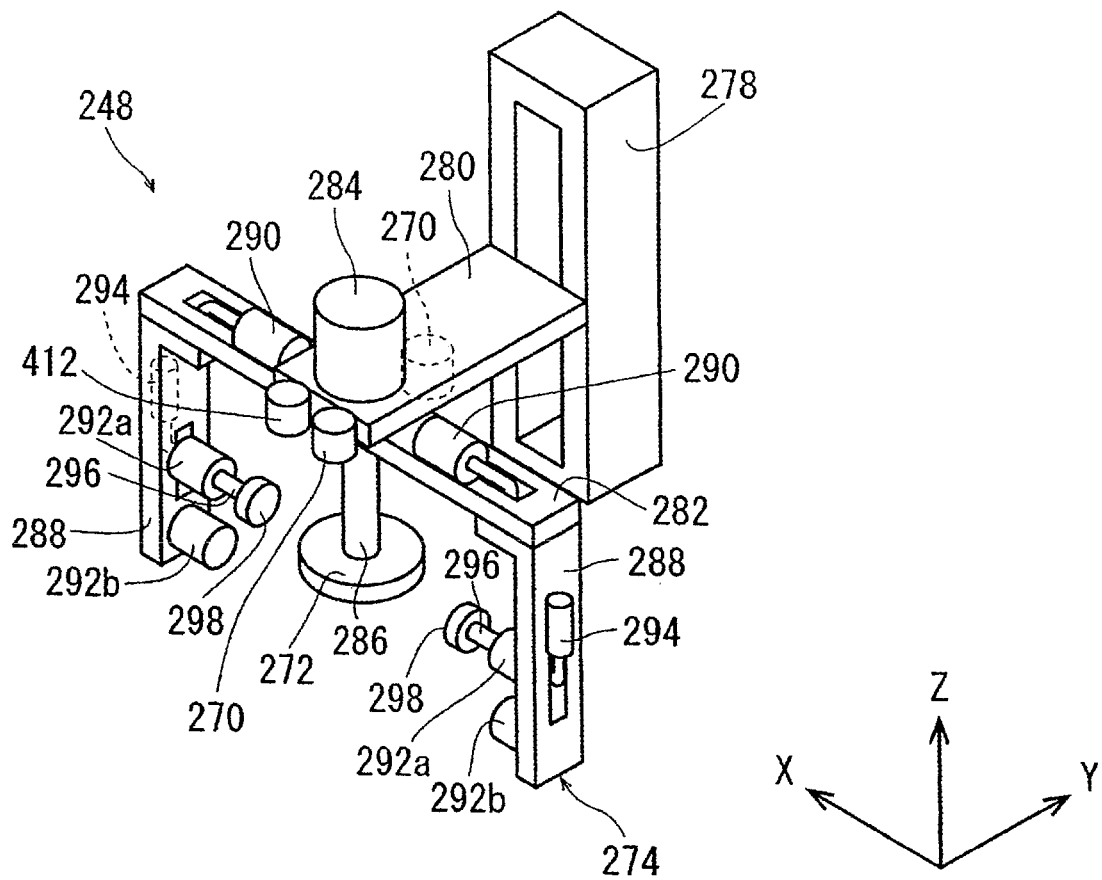
FIG. 14A is a perspective view of a separating part of the beveled part removing unit illustrated in FIG. 1.
Figure 16:
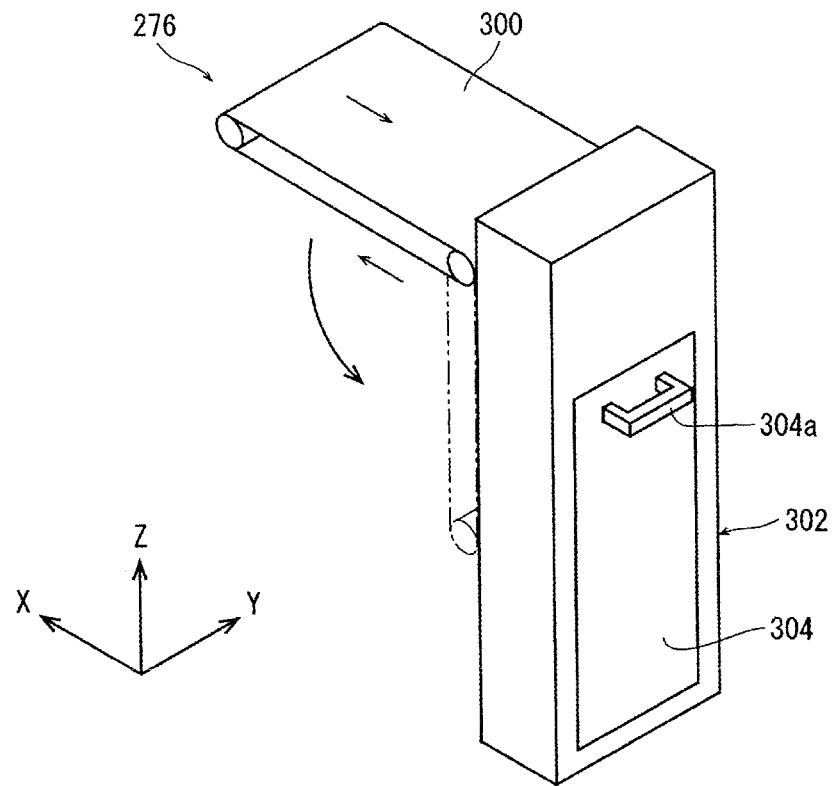
FIG. 16 is a perspective view of a discard part of the beveled part removing unit illustrated in FIG. 1.

As illustrated in FIG. 1, the separating part 248 is disposed at an interval from the first raising-lowering table 246 in the Y-axis direction in the movable range of the temporary placement table 204 in the Y-axis direction. Referring to FIG. 14A and FIG. 16, the separating part 248 includes ultraviolet irradiation parts 270 (see FIG. 14A) that irradiate the tape 96 corresponding to the cut groove 256 with ultraviolet to reduce the adhesive force of the tape 96 and a second raising-lowering table 272 (see FIG. 14A) that sucks and holds the inside of the wafer 4 in such a manner that the beveled part 24 is exposed from the outer circumference, and supports the annular frame 64. The separating part 248 further includes a separator 274 (see FIG. 14A) that acts on the beveled part 24 and separates the beveled part 24 into a ring manner and a discard part 276 (see FIG. 16) by which the separated beveled part 24 is discarded.

As illustrated in FIG. 14A, the separating part 248 of the present embodiment includes a Z-axis guide component 278 that is fixed to an appropriate bracket (not illustrated) and extends in the Z-axis direction, a Z-axis movable component 280 supported by the Z-axis guide component 278 movably in the Z-axis direction, and a Z-axis feed mechanism (not illustrated) that moves the Z-axis movable component 280 in the Z-axis direction. It suffices for the Z-axis feed mechanism to be a configuration having a ball screw that is coupled to the Z-axis movable component 280 and extends in the Z-axis direction and a motor that rotates this ball screw.

A support piece 282 is supported and a support shaft 286 is rotatably supported by the lower surface of the tip of the Z-axis movable component 280. The above-described second raising-lowering table 272 is coupled to the support shaft 286. A motor 284 that rotates the second raising-lowering table 272 together with the support shaft 286 is attached to the upper surface of the tip of the Z-axis movable component 280. A pair of the above-described ultraviolet irradiation parts 270 are annexed to the support piece 282 of the present embodiment at an interval in the Y-axis direction.

The second raising-lowering table 272 is circular and the diameter of the second raising-lowering table 272 is slightly smaller than that of the device region 18 of the wafer 4. Plural suction holes (not illustrated) are formed in the lower surface of the second raising-lowering table 272 and each suction hole is connected to suction means.

Furthermore, the above-described separator 274 is mounted on the support piece 282. The separator 274 includes a pair of movable pieces 288 disposed on the lower surface of the support piece 282 at an interval movably in the longitudinal direction of the support piece 282 and a pair of a feed mechanism 290 that move the pair of movable pieces 288. Each of the pair of feed mechanisms 290 can be configured from an appropriate actuator such as an air cylinder or an electric cylinder.

The separator 274 includes a pair of clamping rollers 292a and 292b supported by each movable piece 288 at an interval in the upward-downward direction and Z-axis feed mechanisms 294 that move the upper clamping roller 292a in the Z-axis direction. The Z-axis feed mechanisms 294 can be configured from an appropriate actuator such as an air cylinder or an electric cylinder. The respective clamping rollers 292a and 292b are supported by the movable piece 288 rotatably around an axis line that extends in the X-axis direction. A pressing roller 298 is mounted to the upper clamping roller 292a with the interposition of a support shaft 296.

Referring to FIG. 16, the discard part 276 includes a belt conveyor 300 that conveys the separated beveled part 24 and a dust box 302 in which the beveled part 24 conveyed by the belt conveyor 300 is housed. The belt conveyor 300 is positioned by an appropriate actuator (not illustrated) to a collection position (a position illustrated by solid lines in FIG. 16) at which the belt conveyor 300 horizontally extends substantially and a standby position (a position illustrated by two-dot chain lines in FIG. 16) at which the belt conveyor 300 vertically extends substantially. A door 304 to which a handle 304a is annexed is disposed at the side surface of the dust box 302 on the near side in the X-axis direction in FIG. 16. A crusher (not illustrated) that crushes the collected beveled part 24 is attached inside the dust box 302. In the dust box 302, by grasping the handle 304a and opening the door 304, crushed waste of the collected beveled part 24 housed in the dust box 302 can be taken out.

When the temporary placement table 204 on which the frame unit U in which the cut groove 256 is formed at the base of the beveled part 24 is temporarily placed is positioned below the separating part 248 by the temporary placement table conveying part 232, as illustrated in FIG. 15, the separating part 248 sucks and holds the side of the back surface 4b of the wafer 4 of the frame unit U by the second raising-lowering table 272 and clamps the annular frame 64 by the clamping rollers 292a and 292b of the separator 274. Then, the separating part 248 executes irradiation with ultraviolet from the pair of ultraviolet irradiation parts 270 and reduces the adhesive force of the tape 96 stuck to the beveled part 24. In addition, the separating part 248 rotates, by the motor 284, the frame unit U together with the support shaft 286 and the second raising-lowering table 272 relative to the separator 274 while pressing the beveled part 24 downward by the pressing rollers 298. Thereby, the separating part 248 separates the beveled part 24 from the frame unit U. The separated beveled part 24 is conveyed to the dust box 302 by the belt conveyor 300 and is collected. When the beveled part 24 is separated, the separator 274 may be rotated relative to the frame unit U.

Figure 14B:
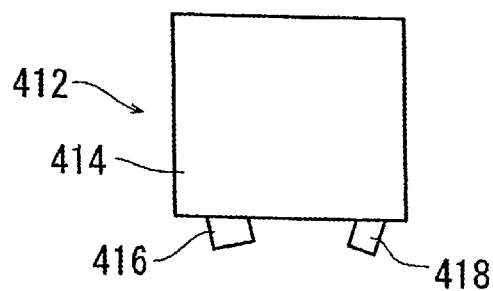
FIG. 14B is a schematic diagram of a removal detecting unit illustrated in FIG. 14A.

As illustrated in FIG. 14 and FIG. 15, the beveled part removing unit 194 of the present embodiment has a removal detecting unit 412 that detects whether or not the beveled part 24 has been removed. The removal detecting unit 412 is disposed adjacent to the ultraviolet irradiation part 270. The removal detecting unit 412 has a main body 414 supported by the support piece 282 and a light emitting part 416 and a light receiving part 418 that are both mounted on the lower surface of the main body 414. As illustrated in FIG. 15, the light emitting part 416 executes irradiation with light L1 toward the region in which the beveled part 24 has existed for the frame unit U that is held by the second raising-lowering table 272 and from which the beveled part 24 has been removed. Furthermore, the light receiving part 418 receives reflected light L2 arising from reflection of the light L1 of the light emitting part 416 at the beveled part 24 that remains without being removed.

Moreover, in the removal detecting unit 412, the region in which the beveled part 24 has existed is irradiated with the light L1 from the light emitting part 416 while the frame unit U that is held by the second raising-lowering table 272 and from which the beveled part 24 has been removed is rotated, and whether or not the beveled part 24 has been completely removed is detected depending on whether or not the amount of light received by the light receiving part 418 is smaller than a predetermined threshold.

When the beveled part 24 has been removed, the tape 96 is irradiated with the light L1 of the light emitting part 416. Therefore, the reflected light L2 hardly exists and the amount of light received by the light receiving part 418 becomes comparatively small. On the other hand, when at least part of the beveled part 24 remains without being removed, the light L1 of the light emitting part 416 is reflected by the beveled part 24 that remains and therefore the amount of light received by the light receiving part 418 becomes comparatively large. Thus, the removal detecting unit 412 determines that the beveled part 24 has been completely removed when the amount of light received by the light receiving part 418 is smaller than the predetermined threshold over the whole circumference of the wafer 4. Conversely, the removal detecting unit 412 determines that at least part of the beveled part 24 remains without being removed when a region about which the amount of light received by the light receiving part 418 is equal to or larger than the predetermined threshold exists.

Figure 17:
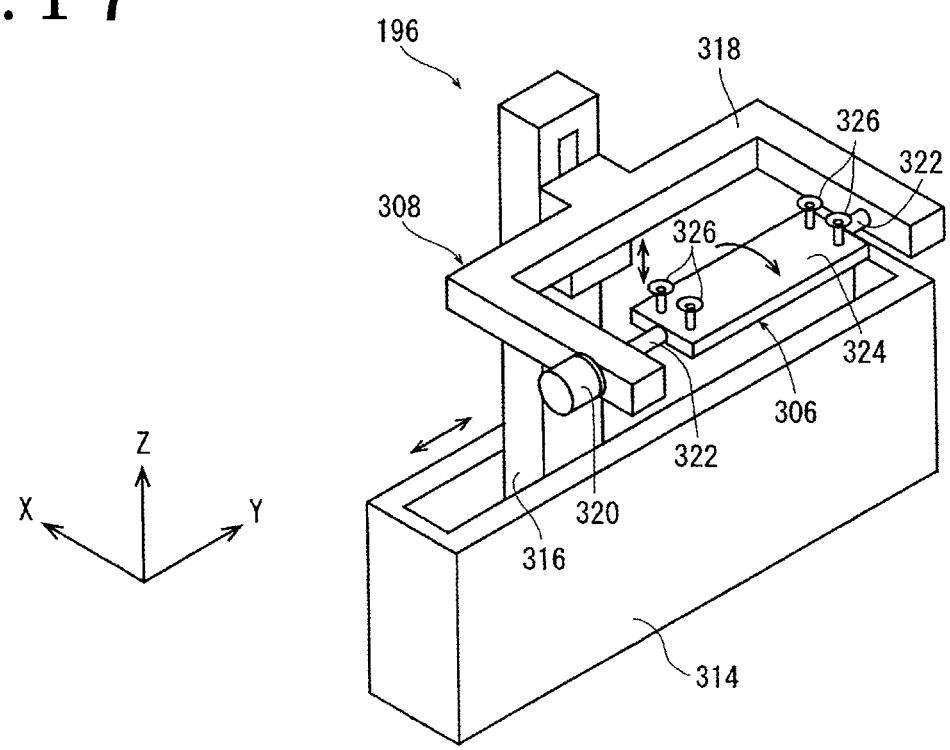
FIG. 17 is a perspective view of an inversion mechanism of beveled part-free unit carrying-out means illustrated in FIG. 1.
Figure 18:
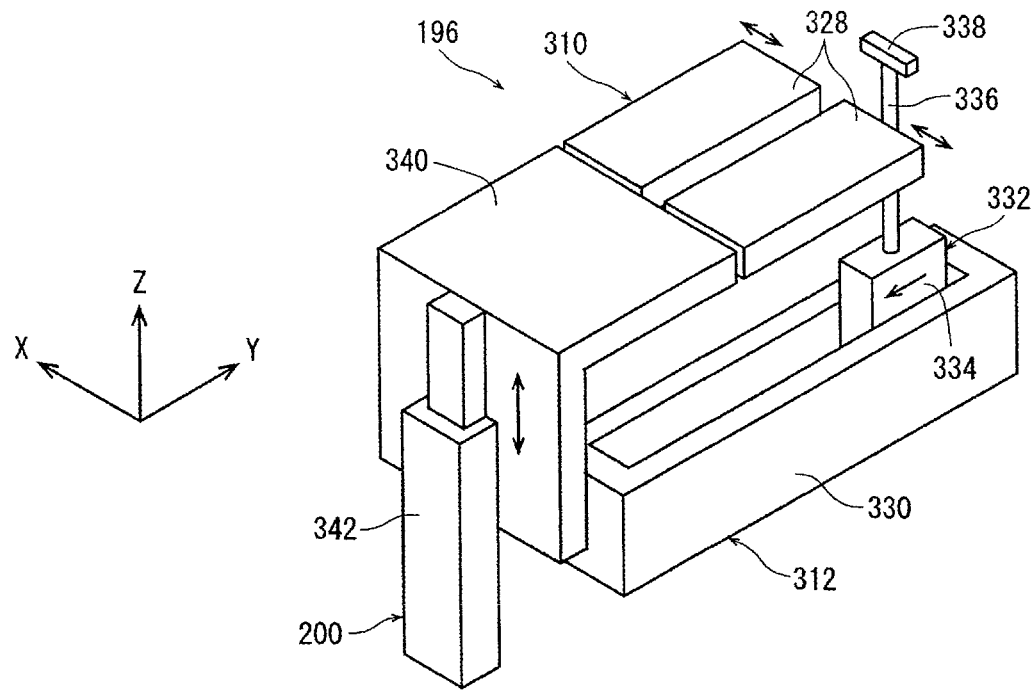
FIG. 18 is a perspective view of a beveled part-free unit support part and a pushing part of the beveled part-free unit carrying-out means illustrated in FIG. 1.

As illustrated in FIG. 1, the beveled part-free unit carrying-out means 196 is disposed adjacent to the beveled part removing unit 194. Referring to FIG. 17 and FIG. 18, the beveled part-free unit carrying-out means 196 of the present embodiment includes an inversion mechanism 308 (see FIG. 17) that includes a frame holding part 306 that faces the beveled part-free unit supported by the second raising-lowering table 272 and holds the annular frame 64 and moves toward the frame cassette table 200 and inverts the frame holding part 306, a beveled part-free unit support part 310 (see FIG. 18) that supports the beveled part-free unit that is inverted by the inversion mechanism 308 and in which the front surface 4a of the wafer 4 is oriented upward, and a pushing part 312 (see FIG. 18) that causes the beveled part-free unit supported by the beveled part-free unit support part 310 to enter the frame cassette 198 placed on the frame cassette table 200 and be housed therein.

As illustrated in FIG. 17, the inversion mechanism 308 includes a Y-axis guide component 314 that extends in the Y-axis direction, a Y-axis movable component 316 supported by the Y-axis guide component 314 movably in the Y-axis direction, a Y-axis feed mechanism (not illustrated) that moves the Y-axis movable component 316 in the Y-axis direction, an arm 318 supported by the Y-axis movable component 316 movably in the Z-axis direction, and a Z-axis feed mechanism (not illustrated) that moves the arm 318 in the Z-axis direction. It suffices for each of the Y-axis and Z-axis feed mechanisms of the inversion mechanism 308 to be a configuration having a ball screw and a motor that rotates the ball screw.

The above-described frame holding part 306 is supported by the arm 318 in such a manner as to be capable of vertically inverting. In addition, a motor 320 that vertically inverts the frame holding part 306 is attached to the arm 318. The frame holding part 306 of the present embodiment includes a substrate 324 rotatably supported by the arm 318 through a pair of rotating shafts 322 and plural suction pads 326 annexed to a single surface of the substrate 324. Each suction pad 326 is connected to suction means (not illustrated). Furthermore, one rotating shaft 322 is coupled to the motor 320.

In the state in which the suction pads 326 are oriented upward, the inversion mechanism 308 sucks and holds, by the suction pads 326, the lower surface of the annular frame 64 of a beveled part-free unit U' supported by the second raising-lowering table 272 and receives the beveled part-free unit U' from the second raising-lowering table 272. Furthermore, the inversion mechanism 308 inverts the frame holding part 306 by the motor 320 to orient the front surface 4a of the wafer 4 upward, and then moves the beveled part-free unit U' held by the frame holding part 306 toward the frame cassette table 200 by moving the Y-axis movable component 316.

As illustrated in FIG. 18, the beveled part-free unit support part 310 of the present embodiment includes a pair of support plates 328 supported through an appropriate bracket (not illustrated) movably in the X-axis direction and interval adjusting means (not illustrated) that adjusts the interval between the pair of support plates 328 in the X-axis direction. The interval adjusting means can be configured from an appropriate actuator such as an air cylinder or an electric cylinder.

A heater (not illustrated) is mounted on the pair of support plates 328 that support the beveled part-free unit U'. In the state in which the interval between the pair of support plates 328 is narrowed, the pair of support plates 328 heat the tape 96 of the beveled part-free unit U' by the heater and thereby eliminate slack and wrinkles of the tape 96 caused due to the removal of the beveled part 24.

The description will be continued with reference to FIG. 18. The pushing part 312 of the present embodiment includes a Y-axis guide component 330 that extends in the Y-axis direction, a Y-axis movable component 332 supported by the Y-axis guide component 330 movably in the Y-axis direction, and a Y-axis feed mechanism (not illustrated) that moves the Y-axis movable component 332 in the Y-axis direction. The Y-axis movable component 332 has a base part 334 supported by the Y-axis guide component 330, a support column 336 that extends upward from the upper surface of the base part 334, and a pressing piece 338 annexed to the upper end of the support column 336. It suffices for the Y-axis feed mechanism of the pushing part 312 to be a configuration having a ball screw that is coupled to the Y-axis movable component 332 and extends in the Y-axis direction and a motor that rotates this ball screw.

As illustrated in FIG. 19, the beveled part-free unit support part 310 expands the interval between the pair of support plates 328 by the interval adjusting means before receiving the beveled part-free unit U', and then receives the beveled part-free unit U' held by the suction pads 326. Then, when the beveled part-free unit support part 310 has received the beveled part-free unit U', the pushing part 312 moves the Y-axis movable component 332 in the Y-axis direction by the Y-axis feed mechanism and thereby causes, by the pressing piece 338, the beveled part-free unit U' supported by the beveled part-free unit support part 310 to enter the frame cassette 198 placed on the frame cassette table 200 and be housed therein.

In the frame cassette 198 illustrated in FIG. 1 and FIG. 19, plural beveled part-free units U' are housed at intervals in the upward-downward direction. As illustrated in FIG. 18 and FIG. 19, the frame cassette table 200 includes a placement part 340 on which the frame cassette 198 is placed and a raising-lowering part 342 that raises and lowers the placement part 340 and positions it to an optional height. It suffices for the raising-lowering part 342 to be a configuration having a ball screw that is coupled to the placement part 340 and extends in the Z-axis direction and a motor that rotates this ball screw.

Next, description will be made about a processing method in which, by using the above-described processing apparatus 2, the dicing tape 96 is stuck to the wafer 4 in which the beveled part 24 is formed in the outer circumferential surplus region 20 to integrate the wafer 4 with the annular frame 64 and the beveled part 24 is cut to be removed in a ring manner from the wafer 4.

In the present embodiment, first, as illustrated in FIG. 1 and FIG. 3, a wafer cassette placement step of placing the wafer cassette 6 in which plural wafers 4 are housed on the wafer cassette table 8 is executed. In the wafer cassette 6, plural wafers 4 are housed at intervals in the upward-downward direction in the state in which the front surfaces 4a are oriented upward.

Furthermore, as illustrated in FIG. 1 and FIG. 5, a frame housing step of housing plural ring-shaped annular frames 64 in which the opening part 64a that houses the wafer 4 is formed in the frame housing unit 66 is executed. The frame housing step may be executed before the wafer cassette placement step or may be executed after the wafer cassette placement step.

In the frame housing step, after the rising-lowering plate 74 of the frame housing unit 66 is lowered to an optional position, the handle 76a is grasped and the door 76 is opened, and the plural annular frames 64 are stacked over the upper surface of the rising-lowering plate 74 to be housed. Furthermore, the height of the rising-lowering plate 74 is adjusted as appropriate and the annular frame 64 at the uppermost level is positioned to a position from which the annular frame 64 can be carried out by the frame carrying-out unit 68.

After the wafer cassette placement step and the frame housing step are executed, a wafer carrying-out step of carrying out the wafer 4 from the wafer cassette 6 placed on the wafer cassette table 8 is executed.

Referring to FIG. 3, in the wafer carrying-out step, first, the Y-axis feed mechanism 34 of the wafer carrying-out unit 10 is actuated and the Y-axis movable component 32 is positioned near the wafer cassette table 8. Subsequently, the conveying arm 42 is driven and the hand 44 in which the air jet ports 46 are oriented upward is positioned to the side of the back surface 4b (lower side) of the wafer 4 in the wafer cassette 6. When the hand 44 is positioned to the side of the back surface 4b of the wafer 4, a gap is made between the back surface 4b of the wafer 4 and the hand 44 and each guide pin 48 is positioned outside in the radial direction.

Next, compressed air is jetted from the air jet ports 46 of the hand 44 to generate a negative pressure on a single surface side of the hand 44 by the Bernoulli effect, and the wafer 4 is sucked and supported from the side of the back surface 4b by the hand 44 in a contactless manner. Subsequently, each guide pin 48 is moved inward in the radial direction and horizontal movement of the wafer 4 sucked and supported by the hand 44 is restricted by the respective guide pins 48. Then, the Y-axis movable component 32 and the conveying arm 42 of the wafer carrying-out unit 10 are moved and the wafer 4 sucked and supported by the hand 44 is carried out from the wafer cassette 6.

It is preferable to execute a notch detection step of detecting the position of the notch 26 of the wafer 4 after executing the wafer carrying-out step. In the notch detection step, as illustrated in FIG. 4, the outer circumference of the wafer 4 sucked and supported by the hand 44 is positioned between the light emitting element 52 and the light receiving element 54 of the notch detecting unit 50. Next, by rotating the wafer 4 by the drive source through the guide pin 48, the position of the notch 26 of the wafer 4 is detected. This makes it possible to adjust the orientation of the wafer 4 to an optional orientation.

After the notch detection step is executed, a wafer support step of supporting the wafer 4 carried out by the wafer carrying-out unit 10 by the wafer table 12 is executed.

Referring to FIG. 3, in the wafer support step, first, the hand 44 of the wafer carrying-out unit 10 is inverted upside down to orient the front surface 4a of the wafer 4 downward. Subsequently, the Y-axis movable component 32 and the conveying arm 42 of the wafer carrying-out unit 10 are moved and the outer circumferential surplus region 20 of the front surface 4a of the wafer 4 sucked and supported by the hand 44 is brought into contact with the annular support part 56 of the wafer table 12. At this time, the device region 18 of the front surface 4a of the wafer 4 is located in the recess 62 of the wafer table 12. Therefore, the devices 14 do not get contact with the wafer table 12 and damage to the devices 14 is prevented.

Next, the outer circumferential surplus region 20 of the front surface 4a of the wafer 4 is sucked and held by actuating the suction means of the wafer table 12 and generating a suction force for each suction hole 60. Subsequently, the suction support of the wafer 4 by the hand 44 is released and the hand 44 is separated from the wafer table 12. In this manner, the wafer 4 is transferred from the wafer carrying-out unit 10 to the wafer table 12. Because the wafer 4 transferred to the wafer table 12 is sucked and held by each suction hole 60, the position of the wafer 4 does not deviate.

Furthermore, after the wafer cassette placement step and the frame housing step are executed, a frame carrying-out step of carrying out the annular frame 64 from the frame housing unit 66 is executed concurrently with the wafer carrying-out step and the wafer support step.

Referring to FIG. 5, in the frame carrying-out step, first, the X-axis movable component 84 and the Z-axis movable component 86 of the frame carrying-out unit 68 are moved and the suction pads 92 of the holding part 88 are brought into contact with the upper surface of the annular frame 64 at the uppermost level housed in the frame housing unit 66. Next, the annular frame 64 at the uppermost level is sucked and held by the suction pads 92 by actuating the suction means of the frame carrying-out unit 68 and generating a suction force for the suction pads 92. Then, the X-axis movable component 84 and the Z-axis movable component 86 of the frame carrying-out unit 68 are moved and the annular frame 64 at the uppermost level sucked and held by the suction pads 92 of the holding part 88 is carried out from the frame housing unit 66.

After the frame carrying-out step is executed, a frame support step of supporting the annular frame 64 carried out by the frame carrying-out unit 68 by the frame table 70 is executed.

The description will be continued with reference to FIG. 5. In the frame support step, first, the X-axis movable component 84 and the Z-axis movable component 86 of the frame carrying-out unit 68 are moved and the annular frame 64 sucked and held by the suction pads 92 is brought into contact with the upper surface of the frame table 70. At this time, the frame table 70 is positioned to the lowering position (a position illustrated by solid lines in FIG. 5) in advance. Subsequently, the suction force of the suction pads 92 of the frame carrying-out unit 68 is deactivated to place the annular frame 64 on the frame table 70. Then, the X-axis movable component 84 and the Z-axis movable component 86 of the frame carrying-out unit 68 are moved and the holding part 88 is separated from the upper side of the frame table 70.

After the frame support step is executed, a tape sticking step of sticking the tape 96 to the annular frame 64 is executed.

Referring to FIG. 6A and FIG. 6B, in the tape sticking step, first, before the frame table 70 is moved from the lowering position (a position illustrated in FIG. 6A) to the rising position (a position illustrated in FIG. 6B) with which the tape 96 can be stuck to the annular frame 64, the tape 96 is pulled out from the roll tape 96R and the tape 96 from which the release paper 116 has been separated is positioned above the frame table 70. The adhesive surface of the tape 96 located above the frame table 70 is oriented downward.

Next, the frame table 70 is raised to such an extent that the tape 96 can be pressed against the annular frame 64 from the upper side by the pressing roller 132 of the pressure bonding part 110 of the tape sticking unit 98. Then, the pressing roller 132 is rolled in the Y-axis direction while the adhesive surface of the tape 96 is pressed against the annular frame 64 by the pressing roller 132. Thereby, the tape 96 pulled out from the roll tape 96R by the tape pull-out part 108 can be pressure-bonded to the annular frame 64.

Subsequently, the cutter 144 and the holding-down roller 146 of the cutting part 112 of the tape sticking unit 98 are lowered to press the cutter 144 against the tape 96 on the annular frame 64 and hold down the annular frame 64 by the holding-down roller 146 from over the tape 96. Next, the arm piece 140 is rotated by the motor 138 and the cutter 144, and the holding-down roller 146 are moved to draw a circle along the annular frame 64. Thereby, the tape 96 that protrudes to the outer circumference of the annular frame 64 can be cut along the annular frame 64. Furthermore, because the annular frame 64 is held down by the holding-down roller 146 from over the tape 96, deviation of the position of the annular frame 64 and the tape 96 is prevented when the tape 96 is being cut. The tape 96 used in which the circular opening part 120 is formed is taken up by the tape take-up part 106.

After the tape sticking step is executed, a tape-attached frame conveyance step of conveying the annular frame 64 to which the tape 96 is stuck to the wafer table 12 and positioning the opening part 64a of the annular frame 64 to the back surface 4b of the wafer 4 supported by the wafer table 12 and placing the tape-attached annular frame 64' on the wafer table 12 is executed.

In the tape-attached frame conveyance step, first, the frame table 70 is moved from the rising position to the lowering position. Subsequently, the Y-axis movable component 150 and the Z-axis movable component 152 of the tape-attached frame conveying unit 100 (see FIG. 5) are moved and the respective suction pads 158 of the holding part 154 of the tape-attached frame conveying unit 100 are brought into contact with the upper surface of the tape-attached annular frame 64' (see FIG. 7) supported by the frame table 70 in the state in which the adhesive surface of the tape 96 is oriented downward.

Next, the upper surface of the tape-attached annular frame 64' is sucked and held by the suction pads 158 by actuating the suction means of the tape-attached frame conveying unit 100 and generating a suction force for the suction pads 158. Subsequently, the Y-axis movable component 150 and the Z-axis movable component 152 of the tape-attached frame conveying unit 100 are moved, and the tape-attached annular frame 64' sucked and held by the suction pads 158 is carried out from the frame table 70.

Next, the tape-attached annular frame 64' sucked and held by the suction pads 158 of the tape-attached frame conveying unit 100 is conveyed to the wafer table 12. Then, as illustrated in FIG. 7, the opening part 64a of the annular frame 64 is positioned to the back surface 4b of the wafer 4 supported by the wafer table 12, and the tape-attached annular frame 64' is brought into contact with the frame support part 58 of the wafer table 12. At this time, the adhesive surface of the tape 96 of the tape-attached annular frame 64' is oriented downward and the back surface 4b of the wafer 4 is oriented upward and faces the adhesive surface of the tape 96.

Subsequently, the suction force of the suction pads 158 of the tape-attached frame conveying unit 100 is deactivated to place the tape-attached annular frame 64' on the frame support part 58 of the wafer table 12. Then, the Y-axis movable component 150 and the Z-axis movable component 152 of the tape-attached frame conveying unit 100 are moved and the holding part 154 is separated from the upper side of the wafer table 12.

After the tape-attached frame conveyance step is executed, a tape pressure bonding step of executing pressure bonding of the tape 96 of the tape-attached annular frame 64' to the back surface 4b of the wafer 4 is executed.

Figure 8:
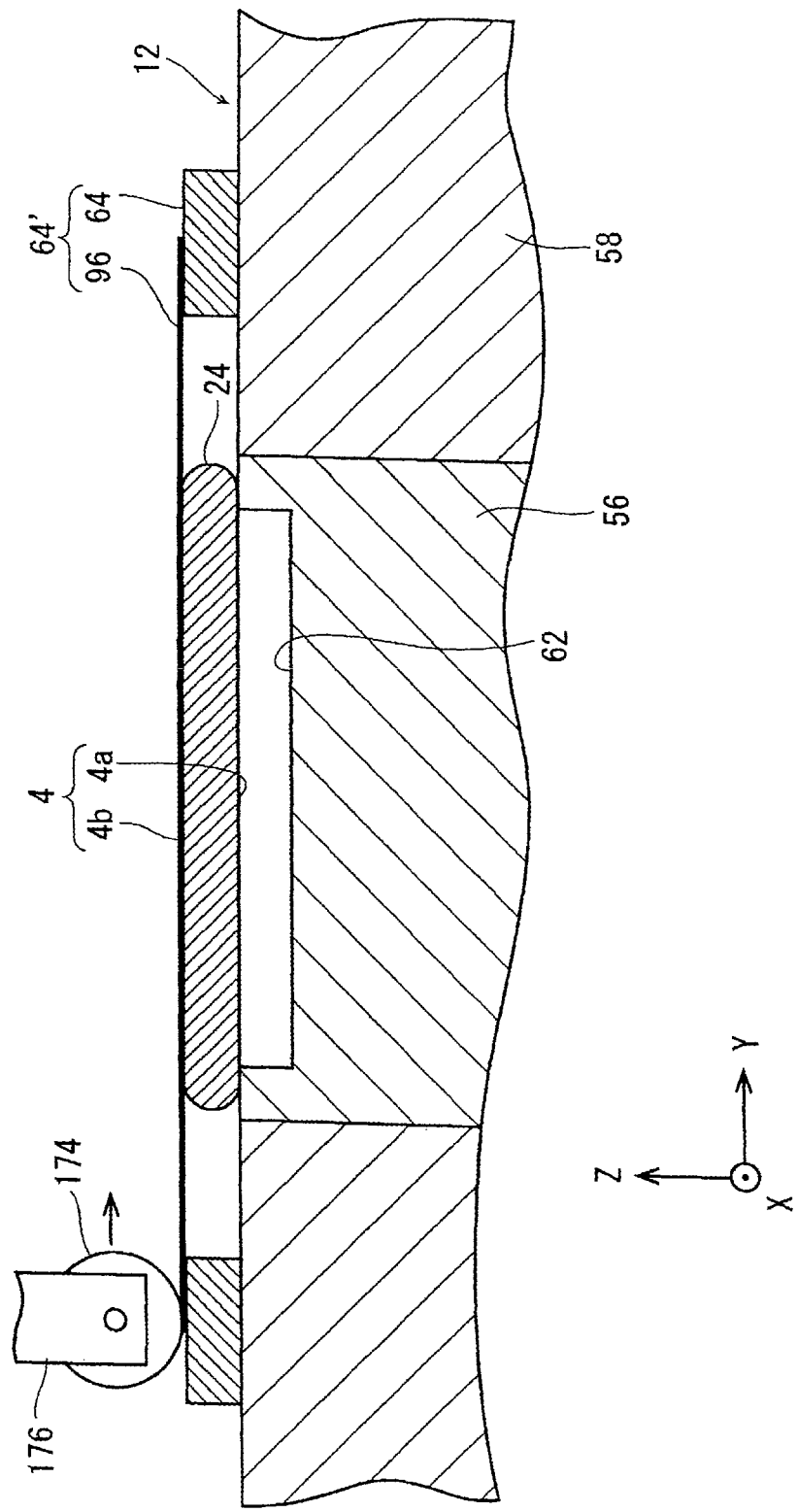
FIG. 8 is a sectional view illustrating the state in which pressing of a tape by a pressing roller is started in a tape pressure bonding step.
Figure 9:
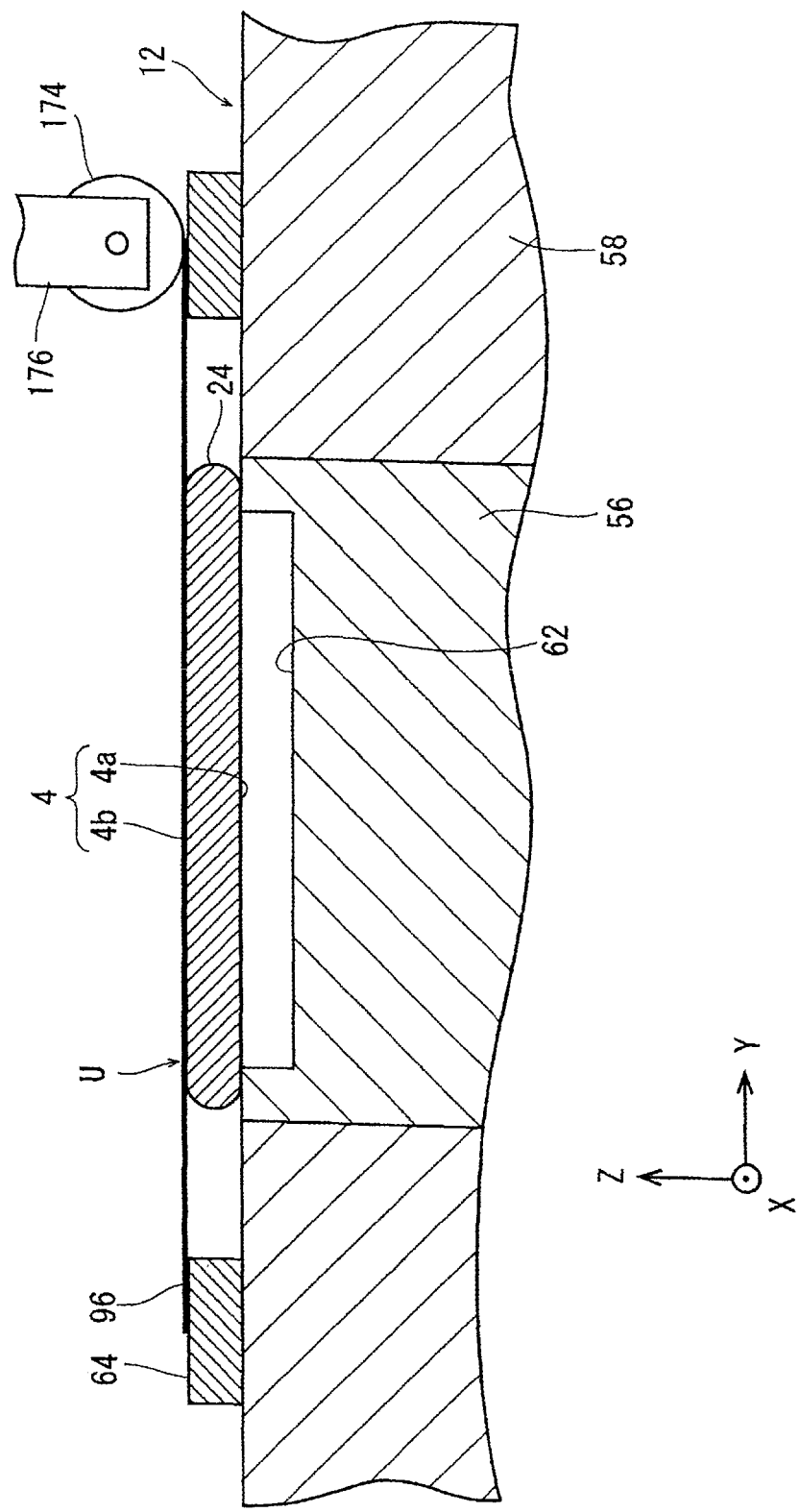
FIG. 9 is a sectional view illustrating the state in which the pressing of the tape by the pressing roller has ended in the tape pressure bonding step.

Referring to FIG. 7 to FIG. 9, in the tape pressure bonding step, first, the upper chamber 160 is lowered by the raising-lowering mechanism 164 of the tape pressure bonding unit 102 and the lower end of the sidewall 172 of the upper chamber 160 is brought into contact with the upper end of the sidewall 186 of the lower chamber 162. Thereby, the upper chamber 160 and the lower chamber 162 are set to the closed state. In addition, the pressing roller 174 is brought into contact with the tape-attached annular frame 64'. Thereupon, as illustrated in FIG. 8, the back surface 4b of the wafer 4 is brought into contact with the adhesive surface of the tape 96 of the tape-attached annular frame 64'.

Next, the vacuum part 166 of the tape pressure bonding unit 102 is actuated in the state in which the opening-to-atmosphere part 168 is closed, and the inside of the upper chamber 160 and the lower chamber 162 is set to a vacuum state. Subsequently, as illustrated in FIG. 8 and FIG. 9, pressure bonding of the tape 96 to the back surface 4b of the wafer 4 is executed by rolling the pressing roller 174 of the tape pressure bonding unit 102 in the Y-axis direction. Thereby, the frame unit U in which the back surface 4b of the wafer 4 and the tape 96 are pressure-bonded can be generated. Next, the opening-to-atmosphere part 168 is opened and the tape 96 is brought into close contact with the back surface 4b of the wafer 4. Then, the upper chamber 160 is raised by the raising-lowering mechanism 164. Due to the setting of the inside of the upper chamber 160 and the lower chamber 162 to the vacuum state, the suction force for the wafer 4 by the wafer table 12 is lost. However, when the upper chamber 160 and the lower chamber 162 are set to the closed state, the back surface 4b of the wafer 4 is brought into contact with the adhesive surface of the tape 96 of the tape-attached annular frame 64'. Thus, the position of the wafer 4 does not deviate in the tape pressure bonding step.

After the tape pressure bonding step is executed, a frame unit carrying-out step of carrying out, from the wafer table 12, the frame unit U in which the tape 96 of the tape-attached annular frame 64' and the back surface 4b of the wafer 4 are pressure-bonded is executed.

Referring to FIG. 5, in the frame unit carrying-out step, first, the conveying part 206 of the frame unit carrying-out means 192 is actuated and the lower surface of the suction adhesion piece 210 of the wafer holding part 202a of the frame unit holding part 202 is brought into contact with the tape 96 on the side of the back surface 4b of the wafer 4. In addition, the suction pads 214 of the frame holding part 202b are brought into contact with the annular frame 64.

Subsequently, a suction force is generated for the suction adhesion piece 210 of the wafer holding part 202a and the suction pads 214 of the frame holding part 202b and the wafer 4 is sucked and held from the side of the back surface 4b (side of the tape 96) by the suction adhesion piece 210 of the wafer holding part 202a. In addition, the annular frame 64 is sucked and held by the suction pads 214 of the frame holding part 202b. Next, the suction holding of the wafer 4 by the wafer table 12 is released. Then, the conveying part 206 is actuated and the frame unit U held by the frame unit holding part 202 is carried out from the wafer table 12.

After the frame unit carrying-out step is executed, a temporary placement step of making the center of the wafer 4 correspond with the center of the temporary placement table 204 and temporarily placing the frame unit U on the temporary placement table 204 is executed.

Referring to FIG. 10, in the temporary placement step, first, the frame unit U held by the frame unit holding part 202 is positioned above the imaging part 224. Subsequently, the conveying part 206 that configures the two-dimensional movement mechanism of the frame unit carrying-out means 192 is actuated and at least three places at the outer circumference of the wafer 4 of the frame unit U held by the frame unit holding part 202 are imaged by the imaging part 224. Thereby, the coordinates of at least three points at the outer circumference of the wafer 4 are measured. Next, the center coordinates of the wafer 4 are obtained based on the measured coordinates of the three points.

Subsequently, the conveying part 206 is actuated and the center of the wafer 4 is positioned to the center of the annular support part 226 of the temporary placement table 204, and the outer circumferential surplus region 20 of the front surface 4*a* of the wafer 4 is brought into contact with the upper surface of the annular support part 226 of the temporary placement table 204. In addition, the lower surface of the annular frame 64 is brought into contact with the upper surface of the frame support part 228 of the temporary placement table 204. At this time, the front surface 4*a* of the wafer 4 is oriented downward. However, because the device region 18 is located in the recess 230 of the temporary placement table 204, the devices 14 do not get contact with the temporary placement table 204 and damage to the devices 14 is prevented.

Next, the suction holding of the wafer 4 by the wafer holding part 202*a* is released and the suction holding of the annular frame 64 by the frame holding part 202*b* is released, to transfer the frame unit U from the frame unit carrying-out means 192 to the temporary placement table 204. Subsequently, the heater of the frame support part 228 is actuated to heat the tape 96 of the frame unit U temporarily placed on the temporary placement table 204 by the heater. Due to this, the tape 96 softens and is brought into close contact with the root of the beveled part 24.

After the temporary placement step is executed, a beveled part removal step of cutting and removing, in a ring manner, the beveled part 24 formed in the outer circumferential surplus region 20 from the wafer 4 of the frame unit U carried out by the frame unit carrying-out means 192 is executed.

Referring to FIG. 1, FIG. 10, and FIGS. 12A to 12C, in the beveled part removal step, first, the X-axis movable component 260 and the Z-axis movable component 262 of the first raising-lowering table 246 of the beveled part removing unit 194 are moved. Thereby, the lower surface of the wafer suction adhesion chuck 400 is brought into contact with the side of the back surface 4*b* of the wafer 4 (side of the tape 96) of the frame unit U temporarily placed on the temporary placement table 204 and the lower surfaces of the frame suction adhesion chucks 402 are brought into contact with the upper surface of the annular frame 64. Next, a suction force is generated for the wafer suction adhesion chuck 400 and the frame suction adhesion chucks 402. Thereby, the wafer 4 of the frame unit U is sucked and held by the wafer suction adhesion chuck 400 and the annular frame 64 is sucked and held by the frame suction adhesion chucks 402.

Subsequently, the X-axis movable component 260 and the Z-axis movable component 262 of the first raising-lowering table 246 are actuated, and, as illustrated in FIG. 11, the frame unit U sucked and held by the holding piece 268 is positioned above the laser beam irradiation unit 244. Next, the focal point of the laser beam LB is positioned to the base of the beveled part 24 of the wafer 4 of the frame unit U.

Subsequently, while the holding piece 268 and the frame unit U are rotated by the motor 266 of the first raising-lowering table 246, the base of the beveled part 24 of the wafer 4 is irradiated with the laser beam LB. This can execute ablation processing for the base of the beveled part 24 of the wafer 4 and form the ring-shaped cut groove 256. Alternatively, a modified layer (not illustrated) may be formed into a ring manner inside the wafer 4 along the outer circumference of the wafer 4 by the irradiation with the laser beam. Furthermore, when the wafer 4 is irradiated with the laser beam LB, the suction means of the laser beam irradiation unit 244 is actuated to generate a suction force for the suction nozzle 254, and debris generated due to the ablation processing is sucked by the suction nozzle 254.

After the ring-shaped cut groove 256 is formed at the base of the beveled part 24 of the wafer 4, whether or not the cut groove 256 has reached the back surface 4*b* from the front surface 4*a* of the wafer 4 is detected by the cut groove detecting unit 404. The detection of the cut groove 256 is executed by measuring the amount of light received by the light receiving part 408 while rotating the frame unit U held by the first raising-lowering table 246.

When a region about which the amount of light received by the light receiving part 408 is smaller than the predetermined threshold exists, it is determined that a part at which the cut groove 256 has not reached the back surface 4*b* from the front surface 4*a* of the wafer 4, i.e. an incompletely-cut part at which the wafer 4 has not been completely cut, exists. When it is determined that the incompletely-cut part exists, the incompletely-cut part of the wafer 4 is irradiated with the laser beam LB by the laser beam irradiation unit 244 to execute ablation processing again. On the other hand, when the amount of light received by the light receiving part 408 is equal to or larger than the predetermined threshold over the whole circumference of the cut groove 256, it is determined that the whole circumference of the cut groove 256 has reached the back surface 4*b* from the front surface 4*a* of the wafer 4 and the wafer 4 has been completely cut.

As above, in the present embodiment, whether the wafer 4 has been completely cut by the cut groove 256 is checked after the cut groove 256 is formed, and ablation processing is executed again if the wafer 4 has not been completely cut. Therefore, conveyance of the frame unit U to the next step in the state in which an incompletely-cut part exists in the wafer 4 is prevented.

Next, the X-axis movable component 260 and the Z-axis movable component 262 of the first raising-lowering table 246 are moved and the outer circumferential surplus region 20 of the front surface 4*a* of the wafer 4 of the frame unit U sucked and held by the holding piece 268 is brought into contact with the upper surface of the annular support part 226 of the temporary placement table 204. In addition, the lower surface of the annular frame 64 is brought into contact with the upper surface of the frame support part 228 of the temporary placement table 204. Subsequently, the suction force of the holding piece 268 of the first raising-lowering table 246 is deactivated to transfer the frame unit U from the first raising-lowering table 246 to the temporary placement table 204.

Next, the temporary placement table 204 that has received the frame unit U is positioned below the separating part 248 of the beveled part removing unit 194 by the temporary placement table conveying part 232 (see FIG. 10). At this time, the belt conveyor 300 of the discard part 276 is positioned to the standby position. Subsequently, the second raising-lowering table 272 of the separating part 248 is lowered and the lower surface of the second raising-lowering table 272 is brought into contact with the tape 96 of the part of the back surface 4b of the wafer 4. Next, a suction force is generated at the lower surface of the second raising-lowering table 272 and the side of the back surface 4b of the wafer 4 of the frame unit U is sucked and held by the second raising-lowering table 272.

Subsequently, the second raising-lowering table 272 that sucks and holds the wafer 4 of the frame unit U is raised to separate the frame unit U from the temporary placement table 204. In addition, the temporary placement table 204 is moved to the lower side of the first raising-lowering table 246. Next, as illustrated in FIG. 15, the pair of feed mechanisms 290 and the Z-axis feed mechanisms 294 of the separator 274 are actuated and the annular frame 64 is clamped in the upward-downward direction by the upper and lower clamping rollers 292a and 292b. Furthermore, the belt conveyor 300 of the discard part 276 is positioned from the standby position to the collection position.

Subsequently, irradiation with ultraviolet from the pair of ultraviolet irradiation parts 270 is executed to reduce the adhesive force of the tape 96 sticking to the beveled part 24. In addition, while the beveled part 24 is pressed downward by the pressing rollers 298, the frame unit U is rotated together with the support shaft 286 and the second raising-lowering table 272 relative to the separator 274 by the motor 284. This can separate the beveled part 24 from the frame unit U. The beveled part 24 that has dropped from the frame unit U is conveyed to the dust box 302 by the belt conveyor 300 and is collected. When the beveled part 24 is separated, the separator 274 may be rotated relative to the frame unit U.

After the beveled part 24 is separated from the frame unit U, whether or not the beveled part 24 has been removed is detected by the removal detecting unit 412. The removal detection of the beveled part 24 is executed by irradiating the region in which the beveled part 24 has existed with the light L1 from the light emitting part 416 and measuring the amount of light received by the light receiving part 418 while rotating the wafer 4 that is held by the second raising-lowering table 272 and from which the beveled part 24 has been removed.

When a region about which the amount of light received by the light receiving part 418 is equal to or larger than the predetermined threshold exists, it is determined that at least part of the beveled part 24 remains without being removed. In this case, work of separating the beveled part 24 from the frame unit U by the separating part 248 is executed again. On the other hand, when the amount of light received by the light receiving part 418 is smaller than the predetermined threshold over the whole circumference of the wafer 4, it is determined that the beveled part 24 has been completely removed.

As above, in the present embodiment, whether the beveled part 24 has been completely removed is checked after the beveled part 24 is removed by the separating part 248, and removal work of the beveled part 24 by the separating part 248 is executed again if the beveled part 24 has not been completely removed. Therefore, conveyance of the frame unit U to the next step in the state in which the beveled part 24 remains in the frame unit U is prevented.

After the beveled part removal step is executed, a beveled part-free unit carrying-out step of carrying out the beveled part-free unit U' resulting from the removal of the beveled part 24 from the beveled part removing unit 194 is executed.

In the beveled part-free unit carrying-out step, first, the belt conveyor 300 of the discard part 276 of the beveled part removing unit 194 is positioned from the collection position to the standby position. Next, the frame holding part 306 of the inversion mechanism 308 (see FIG. 17) of the beveled part-free unit carrying-out means 196 is positioned below the beveled part-free unit U' sucked and held by the second raising-lowering table 272.

Subsequently, the arm 318 is raised in the state in which the suction pads 326 of the frame holding part 306 are oriented upward and the suction pads 326 of the frame holding part 306 are brought into contact with the lower surface side of the annular frame 64 of the beveled part-free unit U' in the state in which the beveled part-free unit U' is supported by the second raising-lowering table 272 and the front surface 4a of the wafer 4 is oriented downward.

Next, a suction force is generated for the suction pads 326 of the frame holding part 306 and the annular frame 64 of the beveled part-free unit U' is sucked and held by the suction pads 326. Subsequently, the suction holding of the beveled part-free unit U' by the second raising-lowering table 272 is released. Thereby, the beveled part-free unit U' is transferred from the second raising-lowering table 272 of the beveled part removing unit 194 to the frame holding part 306 of the beveled part-free unit carrying-out means 196.

After the beveled part-free unit carrying-out step is executed, a beveled part-free unit housing step of housing the beveled part-free unit U' carried out by the beveled part-free unit carrying-out means 196 is executed.

In the beveled part-free unit housing step, first, the inversion mechanism 308 of the beveled part-free unit carrying-out means 196 is inverted upside down and the beveled part-free unit U' sucked and held by the frame holding part 306 is inverted upside down. Due to this, the beveled part-free unit U' is located under the frame holding part 306 and the front surface 4a of the wafer 4 is oriented upward.

Next, the Y-axis movable component 316 and the arm 318 of the inversion mechanism 308 are moved and the beveled part-free unit U' is brought into contact with the upper surfaces of the pair of support plates 328 of the beveled part-free unit support part 310. At this time, the interval between the pair of support plates 328 is narrowed by the interval adjusting means, and the pair of support plates 328 are in close contact with each other. Subsequently, the suction holding of the beveled part-free unit U' by the frame holding part 306 is released to place the beveled part-free unit U' on the pair of support plates 328. Next, slack and wrinkles of the tape 96 caused due to the removal of the beveled part 24 are eliminated by actuating the heater mounted on each support plate 328 and heating the tape 96 of the beveled part-free unit U'. Then, the beveled part-free unit U' is sucked and held and is raised by the frame holding part 306 again.

Next, after the interval between the pair of support plates 328 is enlarged by the interval adjusting means, the beveled part-free unit U' is placed on the upper surfaces of the support plates 328. Then, as illustrated in FIG. 19, the beveled part-free unit U' supported by the beveled part-free unit support part 310 is pushed by the pressing piece 338 of the pushing part 312 and the beveled part-free unit U' is caused to enter the frame cassette 198 placed on the frame cassette table 200 and is housed therein.

The configuration of the embodiment is as above. In the processing apparatus 2 of the present embodiment, work of sticking the dicing tape 96 to the wafer 4 in which the beveled part 24 is formed in the outer circumferential surplus region 20 to integrate the wafer 4 with the annular frame 64 is easy. In addition, it is easy to cut the beveled part 24 and remove it from the wafer 4 and the productivity becomes favorable.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus that removes a beveled part formed in an outer circumferential surplus region from a wafer in a ring manner, the processing apparatus comprising:
    a wafer cassette table on which a wafer cassette in which a plurality of wafers are housed is placed;
    a wafer carrying-out unit that carries out the wafer from the wafer cassette placed on the wafer cassette table;
    a wafer table that supports the wafer carried out by the wafer carrying-out unit;
    a frame housing unit that houses a plurality of annular frames in which an opening part that houses the wafer is formed;
    a frame carrying-out unit that carries out an annular frame from the plurality of annular frames in the frame housing unit;
    a frame table that supports the annular frame carried out by the frame carrying-out unit;
    a tape sticking unit that is disposed over the frame table and sticks a tape to the annular frame;
    a tape-attached frame conveying unit that conveys the annular frame to which the tape is stuck to the wafer table and positions the opening part of the annular frame to one surface of the wafer supported by the wafer table and places a tape-attached frame on the wafer table;
    a tape pressure bonding unit that executes pressure bonding of the tape of the tape-attached frame to the one surface of the wafer;
    frame unit carrying-out means that carries out a frame unit in which the tape of the tape-attached frame and the one surface of the wafer are pressure-bonded by the tape pressure bonding unit from the wafer table;
    a beveled part removing unit that cuts and removes, in a ring manner, the beveled part formed in the outer circumferential surplus region from the wafer of the frame unit carried out by the frame unit carrying-out means;
    beveled-part-free unit carrying-out means that carries out a beveled-part-free unit resulting from the removal of the beveled part in the ring manner from the beveled part removing unit; and
    a frame cassette table on which a frame cassette that houses the beveled-part-free unit carried out by the beveled-part-free unit carrying-out means is placed.

2. The processing apparatus according to claim 1, wherein the wafer carrying-out unit includes a conveying arm, and a hand that is disposed at a tip of the conveying arm and supports the wafer housed in the wafer cassette.

3. The processing apparatus according to claim 2, wherein the hand is a Bernoulli pad on which a negative pressure is generated by a jet of air and that supports the wafer in a contactless manner.

4. The processing apparatus according to claim 1, wherein the wafer table includes an annular support part that supports the outer circumferential surplus region of the wafer and causes a part on an inside relative to the outer circumferential surplus region to be contactless, and a frame support part that is disposed around an outer circumference of the annular support part and supports the annular frame.

5. The processing apparatus according to claim 1, wherein the tape sticking unit includes a roll tape support part that supports a roll tape into which the tape before use is wound, a tape take-up part that takes up the tape used, a tape pull-out part that pulls out the tape from the roll tape, a pressure bonding part that executes pressure bonding of the tape pulled out to the annular frame, and a cutting part that cuts the tape protruding to outer circumference of the annular frame along the annular frame.

6. The processing apparatus according to claim 1, wherein the tape pressure bonding unit includes an upper chamber disposed over the wafer table, a lower chamber in which the wafer table is housed, a raising-lowering mechanism that raises and lowers the upper chamber and generates a closed state in which the upper chamber is brought into contact with the lower chamber and an opened state in which the upper chamber is separated from the lower chamber, a vacuum part that sets the upper chamber and the lower chamber to a vacuum state in the closed state, and an opening-to-atmosphere part that opens the upper chamber and the lower chamber to atmosphere, and
in a state in which the tape of the tape-attached frame is positioned to the one surface of the wafer supported by the wafer table, the upper chamber and the lower chamber are set to a vacuum state while the raising-lowering mechanism is actuated to keep the closed state, and pressure bonding of the tape of the tape-attached frame to the one surface of the wafer is executed by a pressing roller disposed in the upper chamber.

7. The processing apparatus according to claim 1, wherein the frame unit carrying-out means includes a frame unit holding part having a wafer holding part that holds the wafer and a frame holding part that holds the annular frame and a conveying part that conveys the frame unit holding part to a temporary placement table.

8. The processing apparatus according to claim 7, wherein the frame unit carrying-out means includes a two-dimensional movement mechanism that two-dimensionally moves the frame unit holding part in a horizontal direction and an imaging part that images outer circumference of the wafer of the frame unit held by the frame unit holding part, and
the two-dimensional movement mechanism is actuated to image at least three places at the outer circumference of the wafer by the imaging part, and center coordinates of the wafer are obtained to make a center of the wafer correspond with a center of the temporary placement table.

9. The processing apparatus according to claim 7, wherein the beveled part removing unit includes a laser beam irradiation unit that irradiates a base part of the beveled part formed at an outer circumference of the wafer with a laser beam to form a cut groove or form a modified layer inside the wafer, a first raising-lowering table that holds and raises the frame unit temporarily placed on the temporary placement table and positions the frame unit relative to the laser beam irradiation unit, and a separating part that separates the beveled part from the cut groove or the modified layer in the ring manner, the separating part includes an ultraviolet irradiation part that irradiates the tape corresponding to the beveled part with ultraviolet to reduce an adhesive force of the tape, a second raising-lowering table that sucks and holds inside of the wafer in such a manner that the beveled part is exposed from outer circumference, and supports the annular frame, a separator that acts on the beveled part and separates the beveled part in the ring manner, and a discard part by which the beveled part separated is discarded, and the first raising-lowering table temporarily places the frame unit in which the cut groove or the modified layer is formed on the temporary placement table, and the temporary placement table is positioned relative to the separating part by a temporary placement table conveying part, and the second raising-lowering table supports the frame unit temporarily placed on the temporary placement table.

10. The processing apparatus according to claim 9, wherein the temporary placement table has a heater and the first raising-lowering table holds, from the temporary placement table, the frame unit in which the tape has been heated by the heater and the tape is in close contact with a root of the beveled part.

11. The processing apparatus according to claim 10, wherein the beveled-part-free unit carrying-out means includes an inversion mechanism that has a frame holding part that faces the beveled-part-free unit supported by the second raising-lowering table and holds the annular frame and moves toward the frame cassette table and inverts the frame holding part, a beveled-part-free unit support part that supports the beveled-part-free unit that is inverted by the inversion mechanism and in which the other surface of the wafer is oriented upward, and a pushing part that causes the beveled-part-free unit supported by the beveled-part-free unit support part to enter the frame cassette placed on the frame cassette table and be housed in the frame cassette.

12. The processing apparatus according to claim 9, wherein the temporary placement table includes an annular support part that supports the outer circumferential surplus region of the wafer and causes a part on an inside relative to the outer circumferential surplus region to be contactless, and a frame support part that is disposed around an outer circumference of the annular support part and supports the annular frame.

13. The processing apparatus according to claim 9, wherein the beveled part removing unit includes a removal detecting unit that detects whether or not the beveled part has been removed and a cut groove detecting unit that detects the cut groove.

* * * * *